(12) United States Patent
Kawai et al.

(10) Patent No.: US 9,123,749 B2
(45) Date of Patent: Sep. 1, 2015

(54) NONVOLATILE SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Tomoya Kawai, Yokkaichi (JP); Naoki Yasuda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 70 days.

(21) Appl. No.: 14/018,836

(22) Filed: Sep. 5, 2013

(65) Prior Publication Data

US 2014/0264547 A1 Sep. 18, 2014

(30) Foreign Application Priority Data

Mar. 14, 2013 (JP) ................................. 2013-052446

(51) Int. Cl.
*H01L 29/792* (2006.01)
*H01L 29/66* (2006.01)
*H01L 27/115* (2006.01)

(52) U.S. Cl.
CPC .... *H01L 29/66833* (2013.01); *H01L 27/11582* (2013.01); *H01L 29/7926* (2013.01)

(58) Field of Classification Search
CPC ............ H01L 29/792; H01L 29/66833; H01L 29/7926; H01L 27/11582
USPC ......... 257/296, 315, 325, 326, 377, 384, 413, 257/E29.156, E29.161; 438/201, 211, 257, 438/424
See application file for complete search history.

(56) References Cited

U.S. PATENT DOCUMENTS

| | | | | |
|---|---|---|---|---|
| 7,102,193 B1 * | 9/2006 | Wang et al. | | 257/316 |
| 8,349,681 B2 * | 1/2013 | Alsmeier et al. | | 438/216 |
| 8,536,628 B2 * | 9/2013 | Fazan | | 257/288 |
| 2006/0108631 A1 * | 5/2006 | Ding | | 257/315 |

(Continued)

FOREIGN PATENT DOCUMENTS

| | | |
|---|---|---|
| JP | 2003-218362 A | 7/2003 |
| JP | 2008-192857 | 8/2008 |

(Continued)

OTHER PUBLICATIONS

Japanese Office Action dated Jun. 9, 2015, issued in Japanese Patent Application No. 2013-052446 (with English translation).

*Primary Examiner* — Yosef Gebreyesus
(74) *Attorney, Agent, or Firm* — Oblon, McClelland, Maier & Neustadt, L.L.P.

(57) ABSTRACT

According to one embodiment, a nonvolatile semiconductor memory device comprises a semiconductor substrate, a first layer, a first conductive layer, a second conductive layer, an insulating layer, a block insulating layer formed on an inner surface of a pair of through holes formed in the insulating layer, the second conductive layer, and the first conductive layer, and on an inner surface of a connecting hole formed in the first layer and configured, a charge storage layer formed on the block insulating layer, a tunnel insulating layer formed on the charge storage layer, and a semiconductor pillar formed on the tunnel insulating layer. The semiconductor pillar includes a doped silicide layer which is formed in the insulating layer, a silicon layer formed in the second conductive layer and the first conductive layer, and a silicide layer formed in first layer.

11 Claims, 26 Drawing Sheets

(56) References Cited

U.S. PATENT DOCUMENTS

| | | | |
|---|---|---|---|
| 2007/0122971 A1* | 5/2007 | Dobuzinsky et al. | 438/257 |
| 2008/0283839 A1* | 11/2008 | Watanabe et al. | 257/66 |
| 2009/0140323 A1* | 6/2009 | Fazan | 257/324 |
| 2009/0173981 A1 | 7/2009 | Nitta | |
| 2009/0179257 A1 | 7/2009 | Komori et al. | |
| 2010/0039865 A1 | 2/2010 | Kidoh et al. | |
| 2010/0213538 A1 | 8/2010 | Fukuzumi et al. | |
| 2011/0215392 A1* | 9/2011 | Kim et al. | 257/315 |
| 2012/0001247 A1* | 1/2012 | Alsmeier | 257/316 |
| 2012/0008400 A1 | 1/2012 | Fukuzumi et al. | |
| 2014/0126290 A1* | 5/2014 | Sakui et al. | 365/185.05 |

FOREIGN PATENT DOCUMENTS

| | | |
|---|---|---|
| JP | 2009-164433 | 7/2009 |
| JP | 2009-164485 | 7/2009 |
| JP | 2010-199312 | 9/2010 |
| JP | 2012-23091 | 2/2012 |
| JP | 2013-021322 A | 1/2013 |
| WO | WO 2012/003301 A2 | 1/2012 |

* cited by examiner

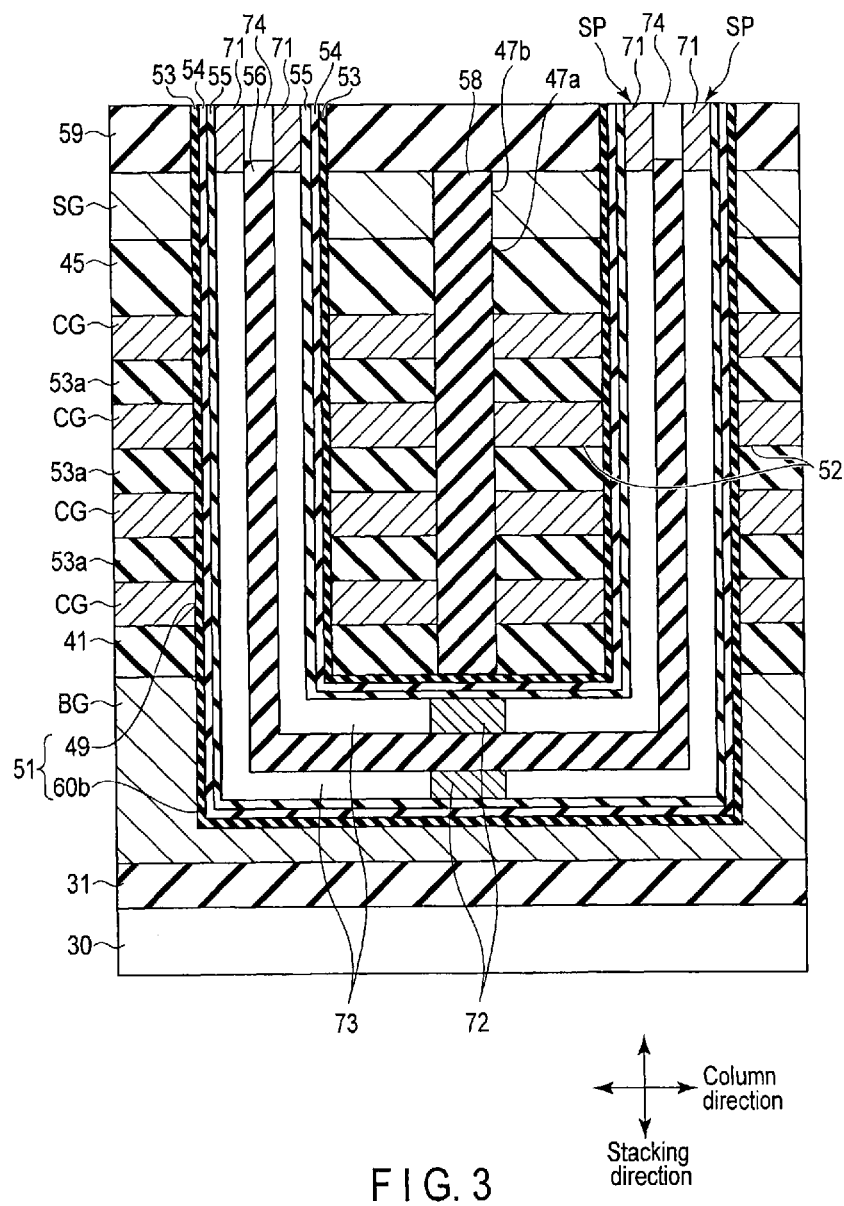
F I G. 3

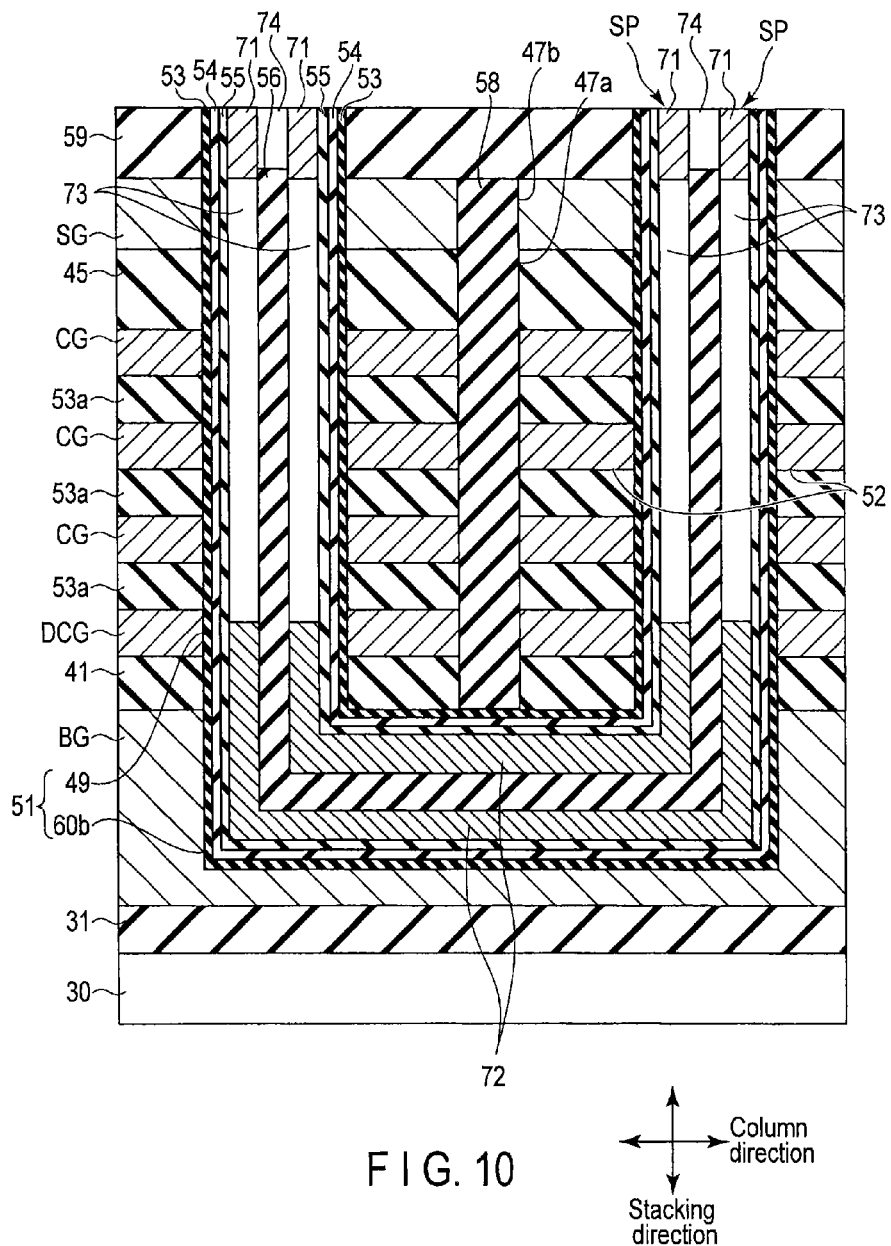
F I G. 10

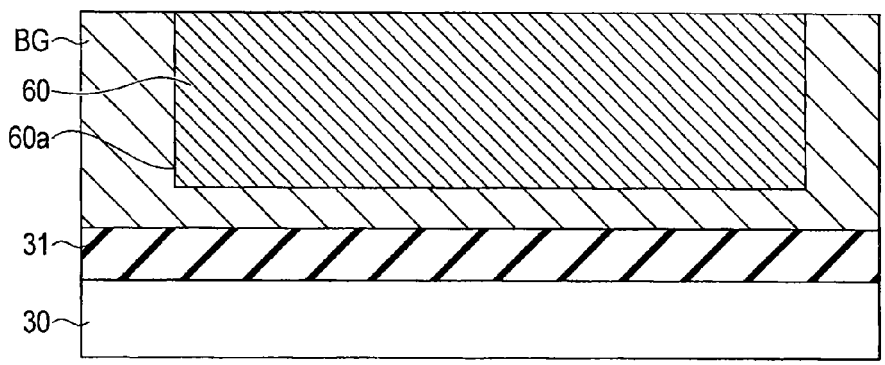
F I G. 11
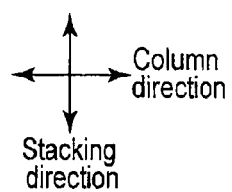

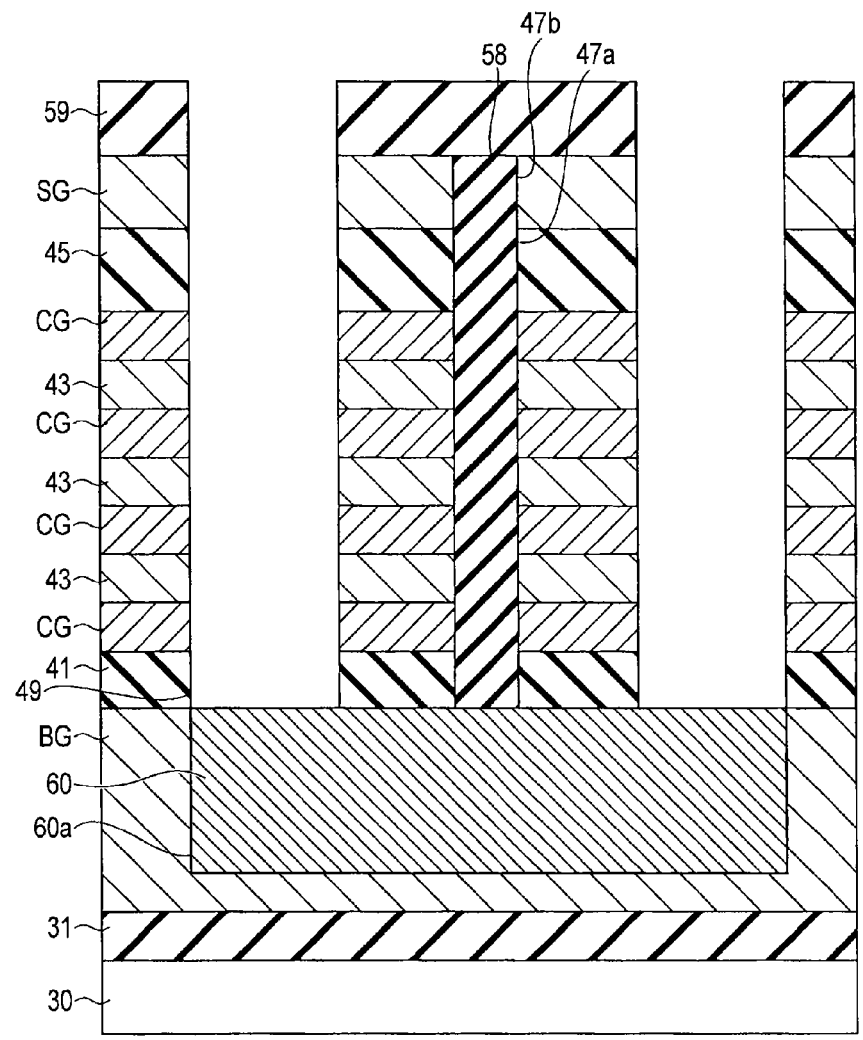
FIG. 13
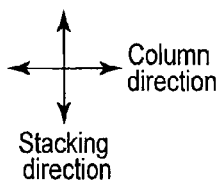

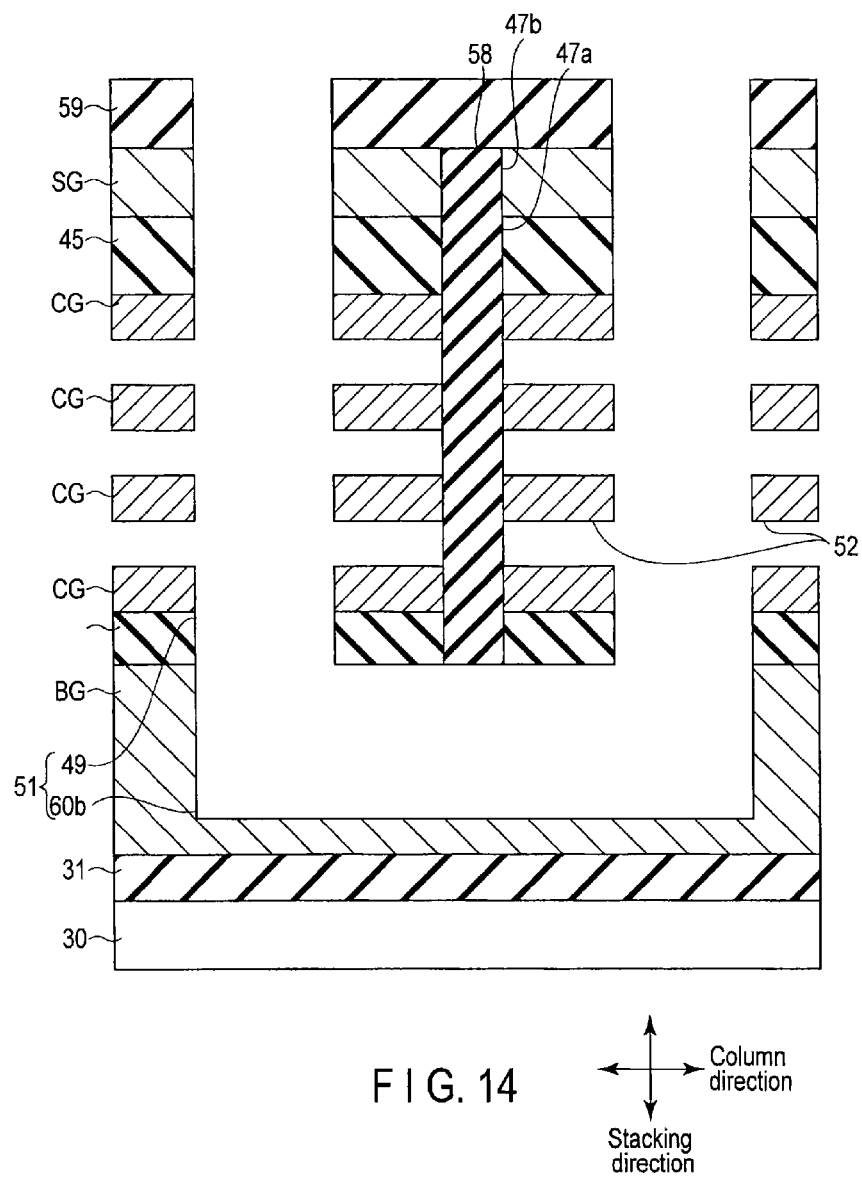
F I G. 14

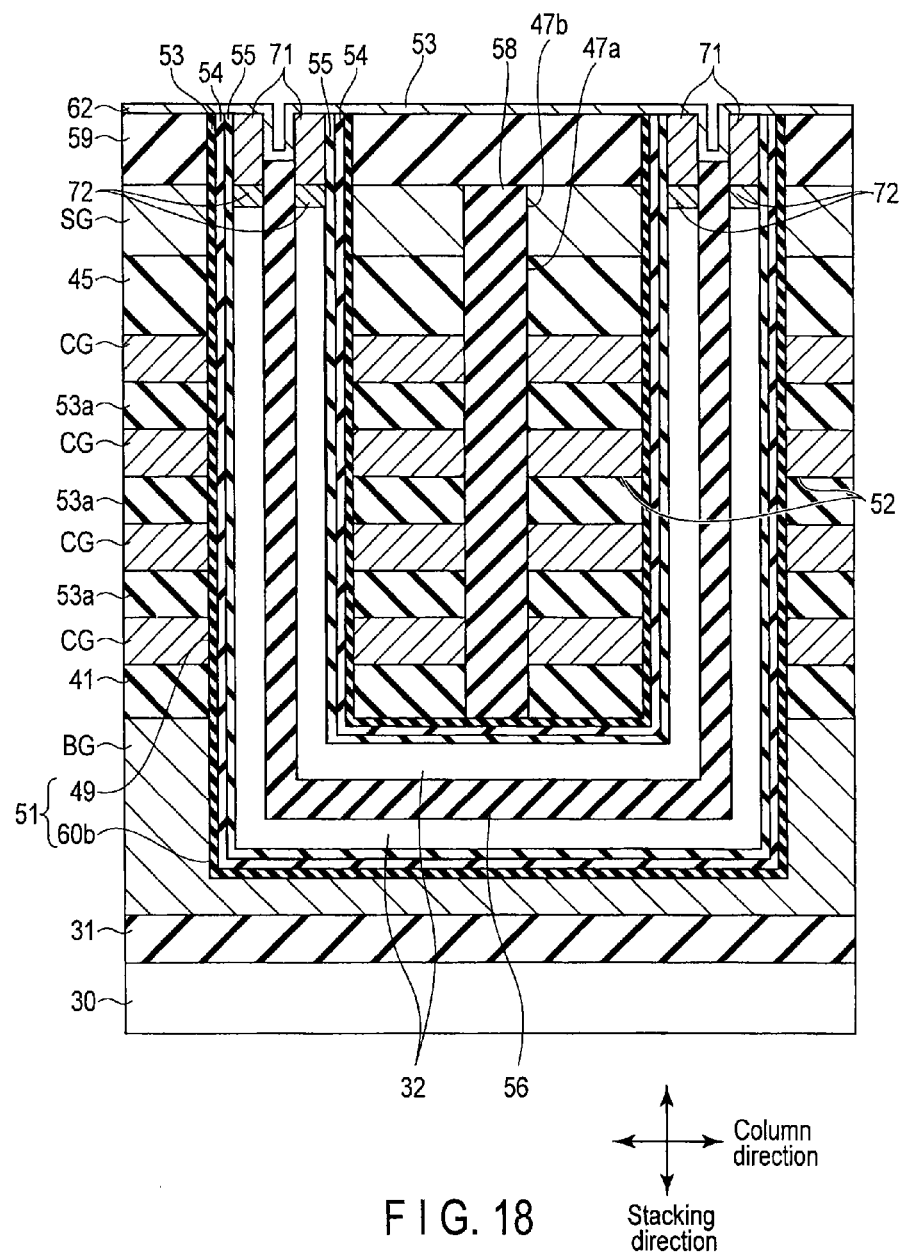
F I G. 18

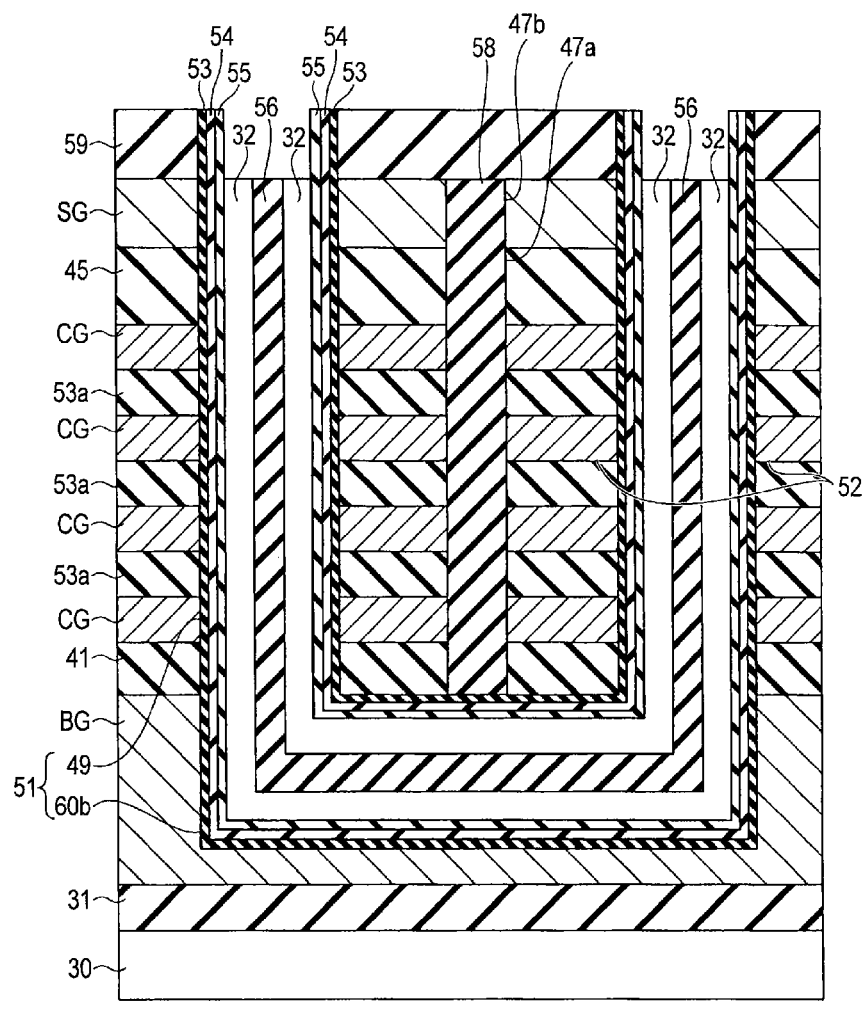
F I G. 21

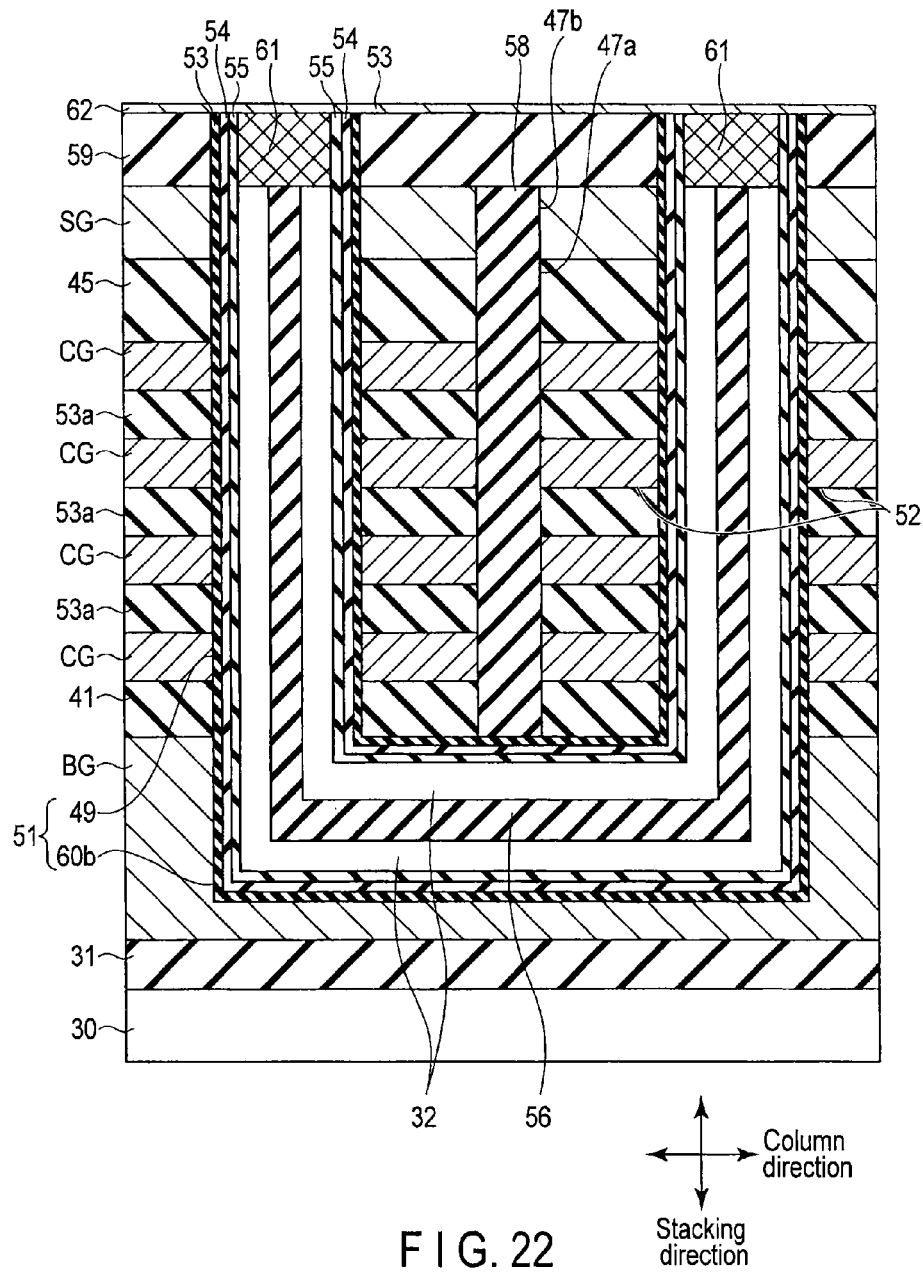
F I G. 22

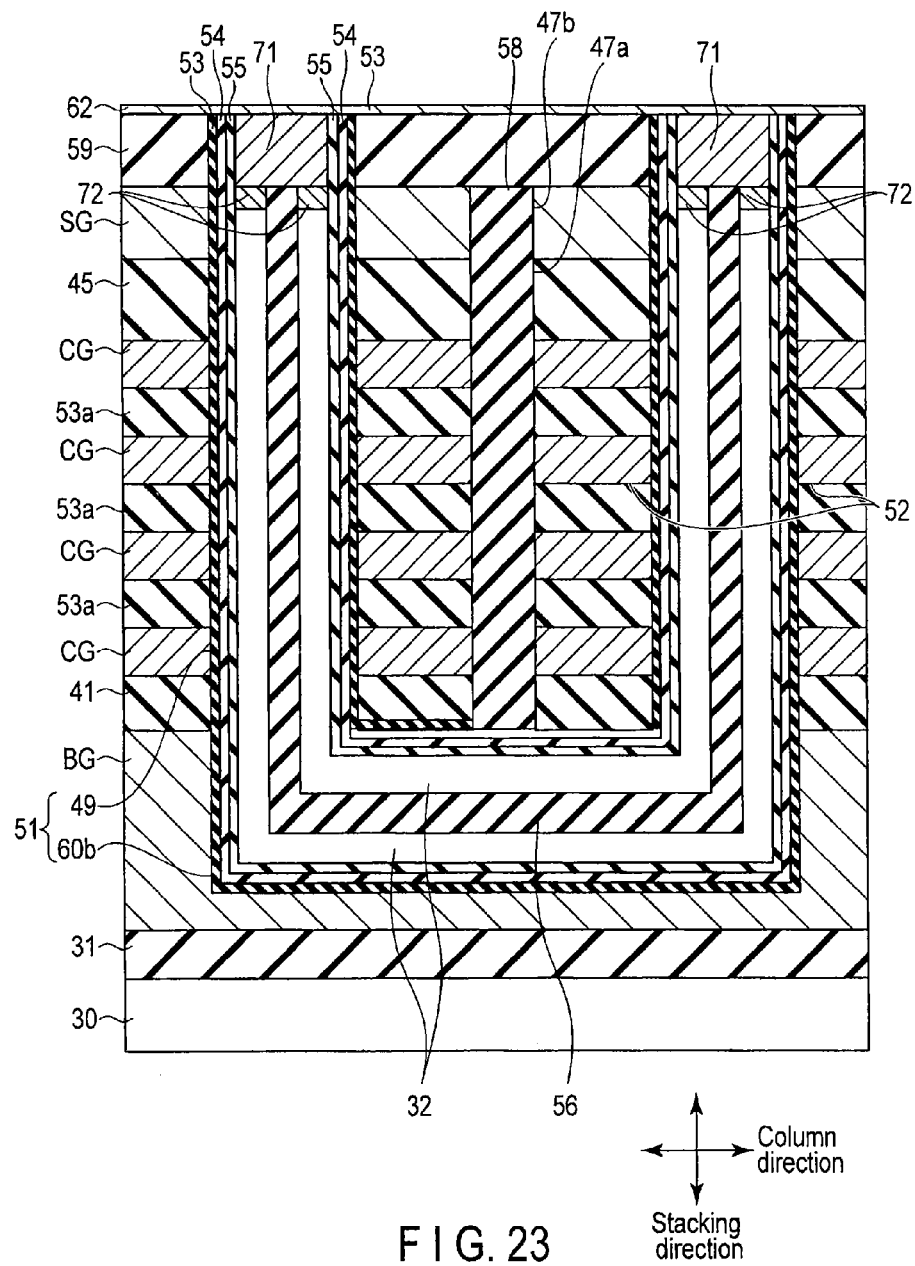
F I G. 23

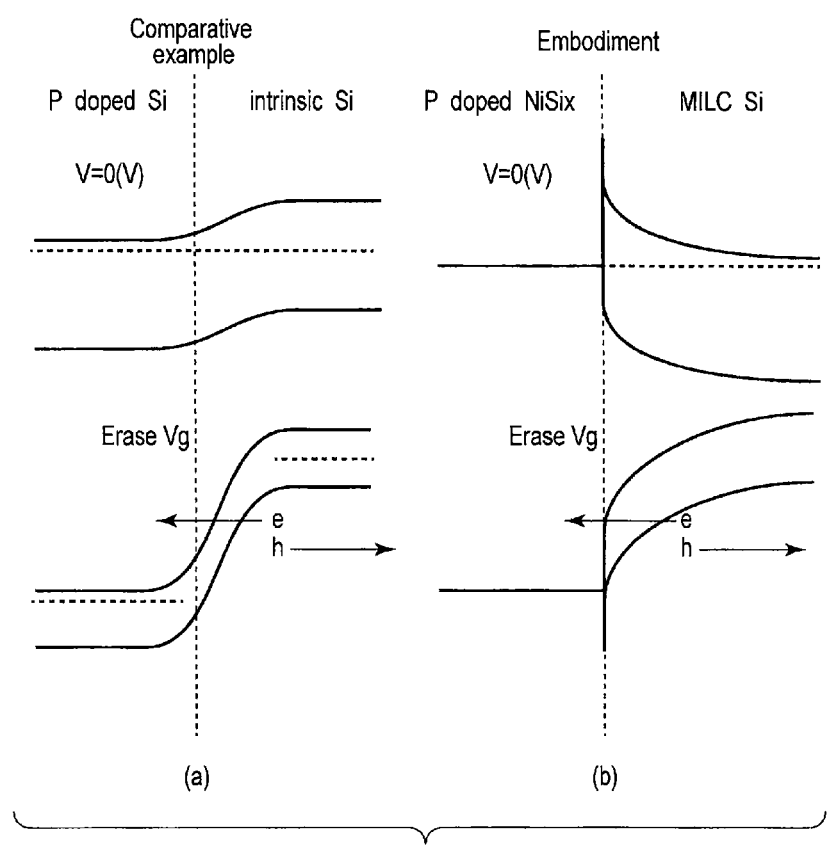
F I G. 25

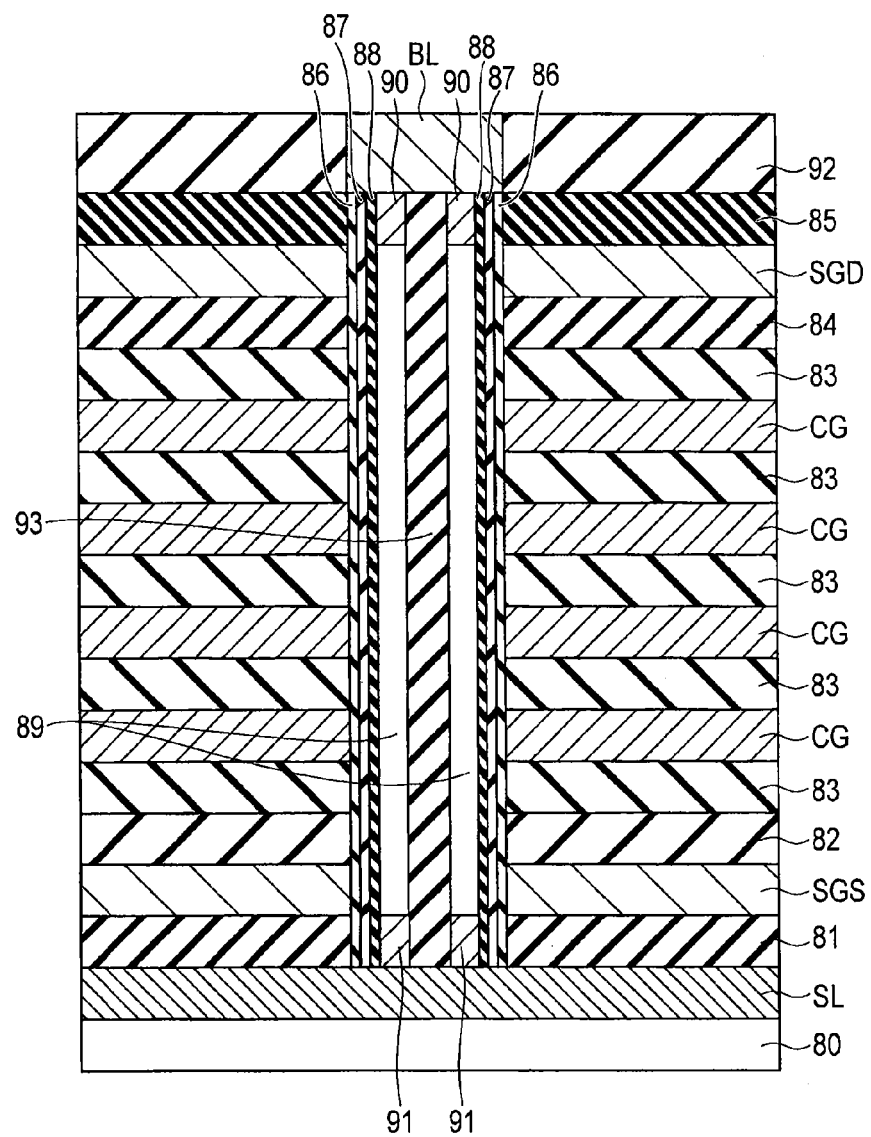
F I G. 26

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2013-052446, filed Mar. 14, 2013, the entire contents of which are incorporated herein by reference.

FIELD

Embodiments described herein relate generally to a nonvolatile semiconductor memory device and a method of manufacturing the same.

BACKGROUND

A BiCS (Bit Cost Scalable) memory multilayered in the vertical direction and formed by collective processing in order to suppress the increase in process cost has been proposed as a NAND flash memory.

In this BiCS memory, a cylindrical memory hole is formed through a plurality of electrodes stacked on a semiconductor substrate at once, and a memory film is formed on the inner wall of the memory hole. After that, polysilicon serving as a channel is formed inside the memory hole. Consequently, a NAND string (memory string) including a plurality of MONOS memory cells connected in series in the stacking direction can be formed at once. It is also possible to achieve a memory capacity higher than that of the conventional floating gate type NAND flash memory.

In this BiCS memory, the diffusion layers (source/drain) of a selection transistor are formed by implanting impurity ions into the same polysilicon as that of the channel. An erase operation is performed by injecting, into a memory cell, holes generated by a GIDL (Gate-Induced Drain Leakage) current in the junction interface between the diffusion layers and channel of the selection transistor. However, ion implantation into the diffusion layers becomes difficult as the thickness of the channel decreases. This decreases the GIDL current and deteriorates the erase characteristic.

Also, the mobility of electric charge decreases as the thickness of the channel decreases or the number of stacked layers increases. That is, the channel electric current reduces, and the operating speed decreases.

Demands have arisen for solving the problems such as the decrease in channel thickness and the increase in number of stacked layers, which has been posed as the micropatterning and the density growth of the memory increase.

BRIEF DESCRIPTION OF THE DRAWINGS

FIG. 3 is a sectional view showing the first configuration example of the NAND string according to the embodiment;

FIG. 10 is a sectional view showing the fourth configuration example of the NAND string according to the embodiment;

FIGS. 11, 12, 13, 14, 15, 16, 17, 18, and 19 are sectional views showing the first manufacturing process of the nonvolatile semiconductor memory device according to the embodiment;

FIGS. 21, 22, 23, and 24 are sectional views showing the second manufacturing process of the nonvolatile semiconductor memory device according to the embodiment;

FIG. 25 is a view showing the bandgap of a semiconductor pillar according to a comparative example and that of a semiconductor pillar according to the embodiment; and FIG. 26 is a sectional view showing an application example of the NAND string according to the embodiment.

DETAILED DESCRIPTION

Figure 1:
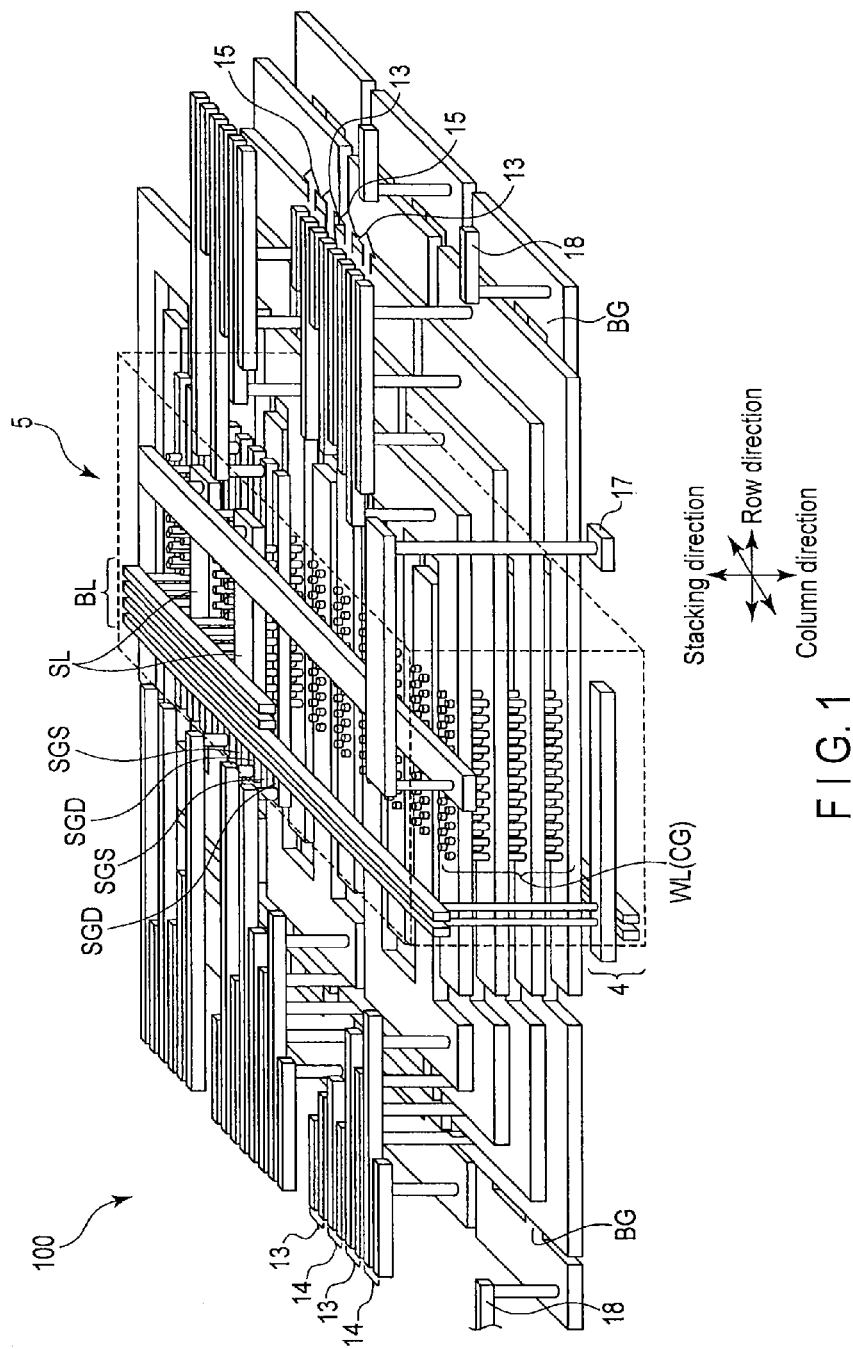
FIG. 1 is a perspective view showing an example of the overall configuration of a nonvolatile semiconductor memory device according to an embodiment.

In general, according to one embodiment, a nonvolatile semiconductor memory device comprises a semiconductor substrate, a first layer formed above the semiconductor substrate, a first conductive layer formed above the first layer, a second conductive layer formed above the first conductive layer, an insulating layer formed on the second conductive layer, a block insulating layer formed on an inner surface of a pair of through holes formed in the insulating layer, the second conductive layer, and the first conductive layer, and extending in a stacking direction, and on an inner surface of a connecting hole formed in the first layer and configured to connect lower end portions of the pair of through holes, a charge storage layer formed on the block insulating layer, a tunnel insulating layer formed on the charge storage layer; and a semiconductor pillar formed on the tunnel insulating layer. The semiconductor pillar includes a doped silicide layer which is formed in the pair of through holes formed in the insulating layer, and in which an impurity is doped, a silicon layer formed in the pair of through holes formed in the second conductive layer and the first conductive layer, and a silicide layer formed in the connecting hole formed in the first layer.

This embodiment will be explained below with reference to the accompanying drawing. In the drawing, the same reference numerals denote the same parts. Also, a repetitive explanation will be made as needed.

Embodiment

A nonvolatile semiconductor memory device according to an embodiment will be explained with reference to FIGS. 1, 2, 3, 4, 5, 6, 7, 8, 9, 10, 11, 12, 13, 14, 15, 16, 17, 18, 19, 20, 21, 22, 23, and 24. This embodiment is directed to an example in which in a semiconductor pillar SP, the diffusion layers of a selection transistor SG are formed by doped silicide layers 71 in which an impurity (e.g., P) is doped, and the channel layer is formed by a single-crystal silicon layer 73. This makes it possible to improve the erase characteristic, and increase the channel current. The nonvolatile semiconductor memory device according to this embodiment will be explained in detail below.

[Overall Configuration Example]

First, an example of the overall configuration of the nonvolatile semiconductor memory device according to the embodiment will be explained with reference to FIG. 1.

FIG. 1 is a perspective view showing the overall configuration example of the nonvolatile semiconductor memory device according to this embodiment.

As shown in FIG. 1, a memory cell array 5 includes a plurality of word lines WL (control gates CG), a plurality of bit lines BL, a plurality of source lines SL, a plurality of backgates BG, a plurality of source-side selection gates SGS, and a plurality of drain-side selection gates SGD.

In the memory cell array 5, memory cell transistors MTr for storing data are arranged at the intersections of the plurality of stacked word lines WL and the silicon pillars SP (to be described later). A plurality of memory cell transistors MTr connected in series along the semiconductor pillar SP form a NAND string 40 (to be described later).

The end portions of the plurality of stacked word lines WL in the row direction form a stepped shape, and a contact is connected to the upper surface of each step. The upper portions of these contacts are connected to interconnections. In the column direction, even-numbered control gates CG are connected to each other at one end in the row direction, and odd-numbered control gates CG are connected to each other at the other end in the row direction. Note that FIG. 1 shows an example in which four layers of the word lines WL are stacked, but the present embodiment is not limited to this.

Also, contacts are connected to the upper surfaces of the end portions of the source lines SL, backgates BG, source-side selection gates SGS, and drain-side selection gates SGD in the row direction. Interconnections are connected in the upper portions of the contacts.

A word line driver 13 is connected to the word lines WL via the interconnections formed in the upper portions and the contacts.

A source-side selection gate line driver 14 is connected to the source-side selection gates SGS via the interconnections formed in the upper portions and the contacts.

A drain-side selection gate line driver 15 is connected to the drain-side selection gates SGD via the interconnections formed in the upper portions and the contacts.

A backgate driver 18 is connected to the backgates BG via the interconnections formed in the upper portions and the contacts.

A source line driver 17 is connected to the source lines SL via the interconnections formed in the upper portions and the contacts.

A sense amplifier 4 is connected via contacts connected to the lower surfaces of the end portions of the bit lines BL in the column direction.

Note that all interconnections connected to the various drivers are formed in an interconnection layer on the same level in FIG. 1, but the present embodiment is not limited to this, and these interconnections may also be formed in interconnection layers on different levels. Note also that the number of drivers is determined in accordance with the number of gates, but one driver can be connected to either one gate or a predetermined number of gates.

<First Configuration Example of NAND String>

Next, the first configuration example of the NAND string 40 according to this embodiment will be explained with reference to FIGS. 2, 3, and 4.

Figure 2:
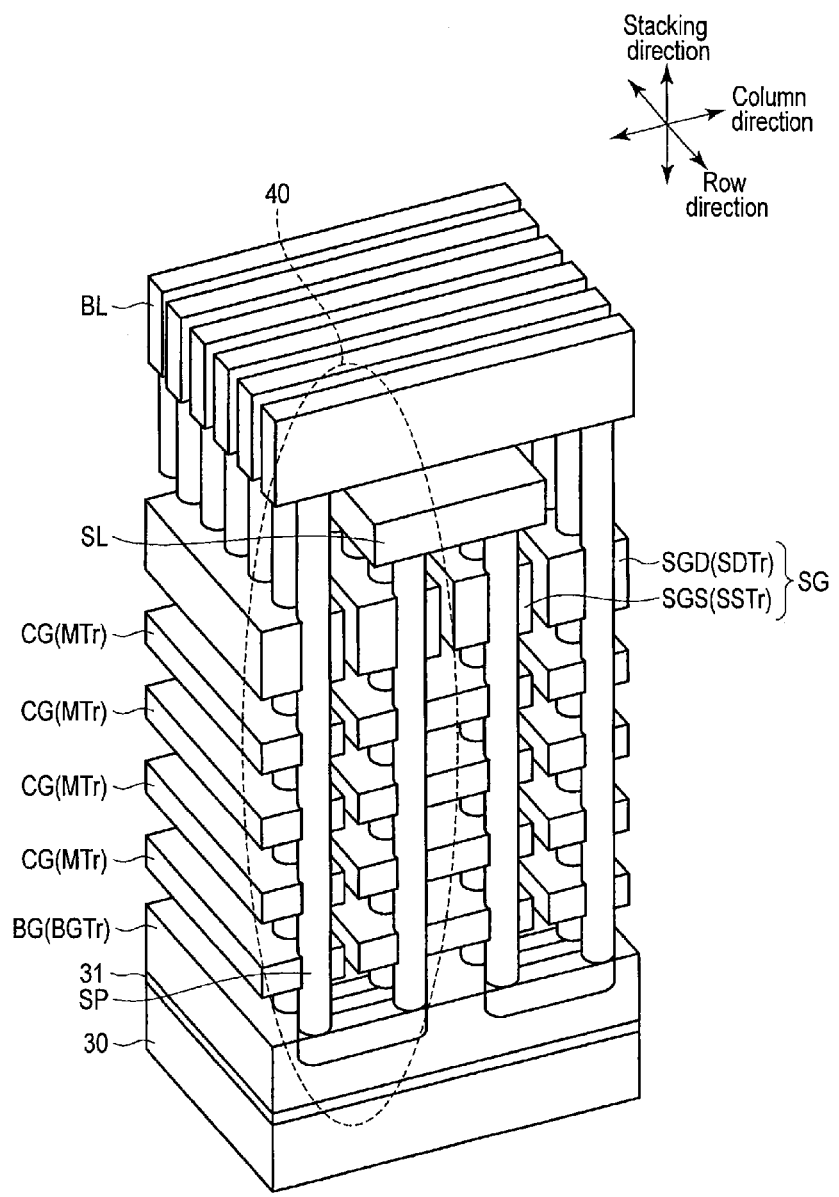
FIG. 2 is a perspective view showing a NAND string according to the embodiment.

FIG. 2 is a perspective view showing the NAND string 40 according to this embodiment. FIG. 3 is a sectional view showing the first configuration example of the NAND string 40 according to the embodiment, and is a view showing the sectional structure of the NAND string 40 along the column direction in more detail. Note that no memory film is illustrated in FIG. 2, and neither source lines SL nor bit lines EL are illustrated in FIG. 3.

In the memory cell array 5 as shown in FIGS. 2 and 3, the NAND string 40 is formed above a semiconductor substrate 30, and includes the backgate BG, a plurality of control gates CG, the selection gate SG, the semiconductor pillar SP, and a memory film (a block insulating layer 53, charge storage layer 54, and tunnel insulating layer 55).

Note that in this specification, the block insulating layer 53, charge storage layer 54, and tunnel insulating layer 55 will be called a memory film, but it is not necessarily a film for storing data.

The backgate BG is formed on an insulating layer 31 on the semiconductor substrate 30. The backgate BG is formed to two-dimensionally spread. The backgate BG is formed by a conductive layer such as a doped silicon layer in which an impurity (e.g., P) is doped.

The plurality of control gates CG are formed on an insulating layer 41 on the backgate BG. Also, the plurality of control gates CG are formed with inter-electrode insulating layers 53a being interposed between them. In other words, the plurality of inter-electrode insulating layers 53a and the plurality of control gates CG are alternately stacked on the insulating layer 41 on the backgate BG. The control gate CG is made of, e.g., a doped silicon layer in which an impurity (e.g., B) is doped.

The selection gate SG is formed on an insulating layer 45 on the uppermost control gate CG. Like the control gate CG, the selection gate SG is made of a doped silicon layer in which an impurity is doped.

The source line SL is formed above the selection gate SG with an insulating layer 59 being interposed between them, and the bit lines BL are formed above the source line SL with an insulating layer (not shown) being interposed between them.

A U-shaped memory hole 51 is formed in the selection gate SG, control gates CG, backgate BG, insulating layers 41, 45, and 59, and inter-electrode insulating layers 53a. The U-shaped memory hole 51 includes a pair of through holes 49 juxtaposed in the column direction, and a connecting hole 60b for connecting the lower ends of the pair of through holes 49. The through holes 49 are formed to extend in the stacking direction in the selection gate SG, control gates CG, insulating layers 41, 45, and 59, and inter-electrode insulating layers 53a. The connecting hole 60b is formed to extend in the column direction in the backgate BG.

Also, a slit 47a expanding in the row direction and stacking direction between the pair of through holes 49 is formed in the control gates CG, insulating layers 41, 45, and 59, and inter-electrode insulating layers 53a. The slit 47a divides the control gates CG, insulating layers 41, 45, and 59, and inter-electrode insulating layers 53a along the row direction. In addition, an opening 47b expanding in the row direction and stacking direction is formed in the selection gate SG above the slit 47a so as to open it. The opening 47b divides the selection gate SG along the row direction: one is the drain-side selection gate SGD, and the other is the source-side selection gate SGS. An insulating material 58 is buried in the slit 47a and opening 47b.

The memory film includes the block insulating layer 53, charge storage layer 54, and tunnel insulating layer 55.

The block insulating layer 53 is formed on the inner surfaces of the U-shaped memory hole 51. That is, the block insulating layer 53 is formed on the selection gate SG, control gates CG, backgate BG, inter-electrode insulating layers 53a, and insulating layers 41 and 45 in the U-shaped memory hole 51. The block insulating layer 53 is an insulating layer made of, e.g., silicon oxide or silicon nitride, or has a multilayered structure of these layers.

The block insulating layer 53 may also be integrated with the inter-electrode insulating layers 53a. That is, each inter-electrode insulating layer 53a may also be formed by burying the block insulating layer 53 in a gap 52 between two control gates CG adjacent to each other in the stacking direction.

The charge storage layer 54 is formed on the block insulating layer 53 in the U-shaped memory hole 51. The charge storage layer 54 is an insulating layer made of, e.g., silicon oxide or silicon nitride, or has a multilayered structure of these layers.

The tunnel insulating layer 55 is formed on the charge storage layer 54 in the U-shaped memory hole 51. The tunnel insulating layer 55 is an insulating layer made of, e.g., silicon oxide or silicon nitride.

The semiconductor pillar SP is formed on the tunnel insulating layer 55 in the U-shaped memory hole 51. That is, the semiconductor pillar SP includes a pair of pillar portions formed on the memory film in the pair of through holes 49, and a connecting portion formed on the memory film in the connecting hole 60b. The semiconductor pillar SP functions as the channel and source/drain diffusion layers of the NAND string 40. Details of the semiconductor pillar SP will be described later.

A core layer 56 is formed on the semiconductor pillar SP in the U-shaped memory hole 51. The core layer 56 is formed by an insulating layer made of, e.g., silicon oxide, and filled in the U-shaped memory hole 51. Note that it is also possible to form a hollow instead of the core layer 56, and leave the U-shaped memory hole 51 unfilled.

In addition, a contact 74 is formed in contact with the semiconductor pillar SP. The contact 74 is formed by a conductive layer such as a metal layer, polysilicon layer, or silicide layer. The upper portion of this contact layer is electrically connected to the source line SL or bit line BL.

Note also that, although not shown, those portions of the selection gate SG and control gates CG, which are in contact with the insulating material 58, can also be silicided.

The semiconductor pillar SP and the memory film and various gates formed around the semiconductor pillar SP form various transistors. The NAND string 40 is formed along the semiconductor pillar SP by using it as a channel.

More specifically, the control gate CG, the semiconductor pillar SP, and the memory film formed between them form the memory cell transistor MTr. Also, the selection gates SG (the drain-side selection gate SGD and source-side selection gate SGS), the semiconductor pillar SP, and the memory film formed between them form selection transistors (a drain-side selection transistor SDTr and source-side selection transistor SSTr). Furthermore, the backgate BG, the semiconductor pillar SP, and the memory film formed between them form a backgate transistor BGTr.

Note that in the selection transistors and backgate transistor BGTr, the memory film does not store data regardless of its name "memory film". Note also that the backgate transistor BGTr is so controlled as to be normally ON during an operation.

Figure 4:
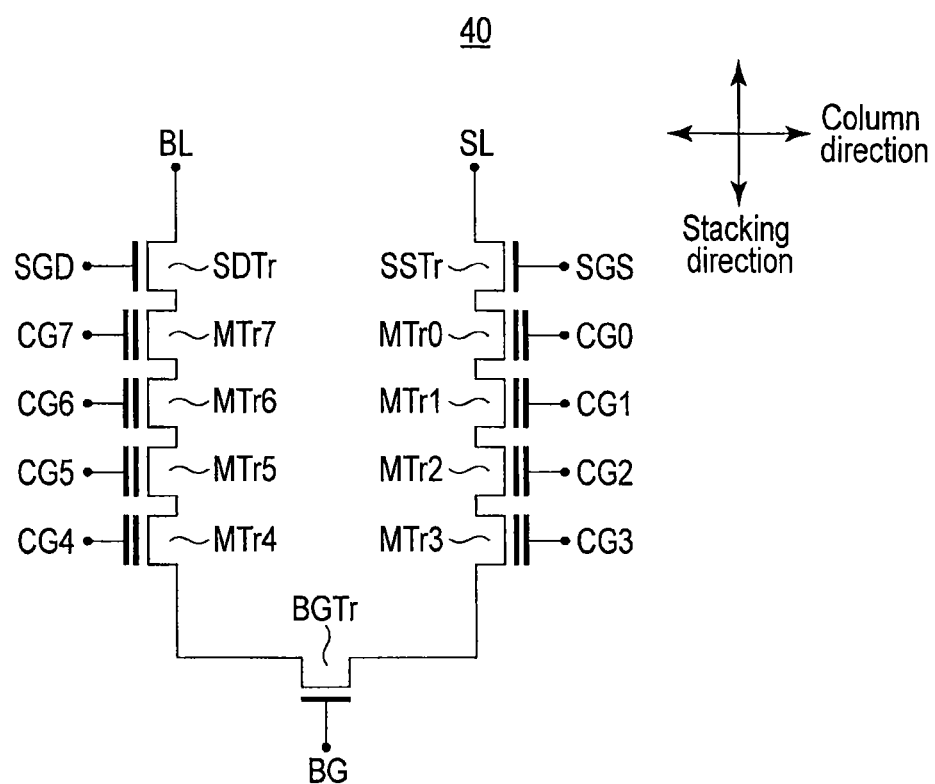
FIG. 4 is a circuit diagram showing the NAND string according to the embodiment.

FIG. 4 is a circuit diagram showing the NAND string 40 according to this embodiment.

As shown in FIG. 4, the NAND string 40 includes the source-side selection transistor SSTr, the drain-side selection transistor SDTr, memory cell transistors MTr0 to MTr7, and the backgate transistor BGTr.

As described previously, the current paths of the memory cell transistors MTr0 to MTr7 are connected in series between the source-side selection transistor SSTr and drain-side selection transistor SDTr. The current path of the backgate transistor BGTr is connected in series between the memory cell transistors MTr3 and MTr4.

More specifically, the current paths of the memory cell transistors MTr0 to MTr3 and the current paths of the memory cell transistors MTr4 to MTr7 are respectively connected in series in the stacking direction. These current paths are connected in series by forming the backgate transistor BGTr between the memory cell transistors MTr3 and MTr4 in the lower portion in the stacking direction. That is, the current paths of the source-side selection transistor SSTr, drain-side selection transistor SDTr, memory cell transistors MTr0 to MTr7, and backgate transistor BGTr are connected in series as the NAND string 40 along the semiconductor pillar SP shown in FIG. 2. In a data write operation and data read operation, the backgate transistor BGTr is normally ON.

Also, the control gates of the memory cell transistors MTr0 to MTr7 are connected to control gates CG0 to CG7, and the control gate of the backgate transistor BGTr is connected to the backgate BG. Furthermore, the gate of the source-side selection transistor SSTr is connected to the source-side selection gate SGS, and the gate of the drain-side selection transistor SDTr is connected to the drain-side selection gate SGD.

The semiconductor pillar SP in the first configuration example of this embodiment will be explained in detail below.

As shown in FIG. 3, the semiconductor pillar SP in the first configuration example of this embodiment includes a doped silicide layer 71, undoped silicide layer 72, and single-crystal silicon layer 73.

The doped silicide layer 71 is formed on the tunnel insulating layer 55 in the U-shaped memory hole 51 formed in the insulating layer 59. The doped silicide layer 71 is made of, e.g., Ni disilicide ($NiSi_2$) in which P is doped. The doped silicide layer 71 functions as the sources/drains of the selection transistors SDTr and SSTr.

"The doped silicide layer 71 is made of Ni disilicide" herein mentioned means that the composition ratio of the doped silicide layer 71 is not $NiSi_2$, but the doped silicide layer 71 contains the crystal structure of $NiSi_2$. In other words, the doped silicide layer 71 at least partially contains the crystal structure of $NiSi_2$. Therefore, the doped silicide layer 71 can partially contain Ni silicide having another Ni—Si composition, such as Ni monosilicide (NiSi), in addition to Ni disilicide.

Also, the concentration of P in the doped silicide layer 71 is, e.g., $1.0 \times 10^{20}$ [atoms/cc] or more. This makes it possible to suppress the migration of Ni disilicide by MILC (to be described later) in the doped silicide layer 71.

Note that the doped silicide layer 71 is not limited to Ni disilicide, and can also contain Co silicide. Furthermore, the doped silicide layer 71 is not limited to this, and need only contain a metal element that forms silicide together with Si. In the following description, an example in which the doped silicide layer 71 is made of Ni disilicide will be explained.

It is also possible to dope As, instead of P, in the doped silicide layer 71. B can also be doped when the channel is a p-channel. Also, the present embodiment is not limited to this, and it is only necessary to use any dopant material that suppresses, when doped, the migration of Ni disilicide by the MILC of the doped silicide layer 71.

The single-crystal silicon layer 73 is formed on the tunnel insulating layer 55 in the U-shaped memory hole 51 formed in the selection gate SG, control gates CG, insulating layers 41 and 45, and inter-electrode insulating layers 53*a*. The single-crystal silicon layer 73 is also formed on a portion of the tunnel insulating layer 55 in the U-shaped memory hole 51 formed in the backgate BG. The end face of the single-crystal silicon layer 73 is formed in contact with the end face of the doped silicide layer 71. The single-crystal silicon layer 73 functions as the channel of the NAND string 40 (the selection transistors SDTr and SSTr, memory cell transistors MTr, and backgate transistor BGTr).

The junction interface between the doped silicide layer 71 and single-crystal silicon layer 73 is desirably higher than the upper surface of the selection gate SG. This is so because if the junction interface between the doped silicide layer 71 and single-crystal silicon layer 73 is lower than the upper surface of the selection gate SG, i.e., if the doped silicide layer 71 overlaps a gate-controllable region, the transistor characteristics may deteriorate, e.g., the off-leak may rise in the selection transistors SDTr and SSTr. However, the present embodiment is not limited to this, and the junction interface between the doped silicide layer 71 and single-crystal silicon layer 73 need only be positioned within a range in which the selection transistors SDTr and SSTr function as selection transistors of the NAND string 40.

The single-crystal silicon layer 73 is formed by changing amorphous silicon 32 (to be described later) into a single crystal by the MILC process using the undoped silicide layer 72 (to be described later) as a catalyst. In other words, the single-crystal silicon layer 73 is obtained by forming the amorphous silicon 32 by solid-phase epitaxial growth by using the undoped silicide layer 72 as a growth end. Therefore, the crystal orientation of the single-crystal silicon layer 73 is the same as or almost the same as that of the undoped silicide layer 72. "The crystal orientations are almost the same" herein mentioned means that the difference between the crystal orientations is ±20° or less.

Also, the Ni concentration in the single-crystal silicon layer 73 is about $5.0 \times 10^{18}$ [atoms/cc] or less. That is, the undoped silicide layer 72 migrates in the amorphous silicon 32 by the MILC process, but the concentration of Ni atoms in the single-crystal silicon layer 73 formed by the MILC process is about $5.0 \times 10^{18}$ or less.

The undoped silicide layer 72 is formed on a portion of the tunnel insulating layer 55 in the U-shaped memory hole 51 formed in the backgate BG. More specifically, the undoped silicide layer 72 exists in a portion of the connecting hole 60*b* in the column direction. In the connecting hole 60*b*, therefore, the single-crystal silicon layer 73, undoped silicide layer 72, and single-crystal silicon layer 73 are formed in this order from one through hole 49 to the other through hole 49.

Furthermore, the end face of the undoped silicide layer 72 is formed in contact with the end face of the single-crystal silicon layer 73. The junction interface between the undoped silicide layer 72 and single-crystal silicon layer 73 is positioned in the connecting hole 60*b*. In other words, the junction interface between the undoped silicide layer 72 and single-crystal silicon layer 73 is lower than the upper surface of the backgate BG. Also, the undoped silicide layer 72 is a silicide layer containing the same metal element as that of the doped silicide layer 71, and made of, e.g., Ni disilicide in which no impurity is doped. The undoped silicide layer 72 is a catalyst in the MILC process, and obtained by performing migration from the upper portion of the through hole 49 to the connecting hole 60*b* by MILC.

By forming the undoped silicide layer 72 in the backgate BG, it is possible to reduce the ON resistance of the backgate transistor BGTr, and increase the channel current. Note that the undoped silicide layer 72 need only be set in a region where the electrical influence of the undoped silicide layer 72 does not contribute to the lowermost control gate CG. The formation region of the undoped silicide layer 72 will be described later in the second to fourth configuration examples.

The doped silicide layer 71, undoped silicide layer 72, and single-crystal silicon layer 73 may each contain Ge. Also, the undoped silicide layer 72 is a silicide layer in which no impurity is doped, but the present embodiment is not limited to this, and the undoped silicide layer 72 may also contain an impurity (e.g., P) to such an extent that MILC occurs.

Figure 5:
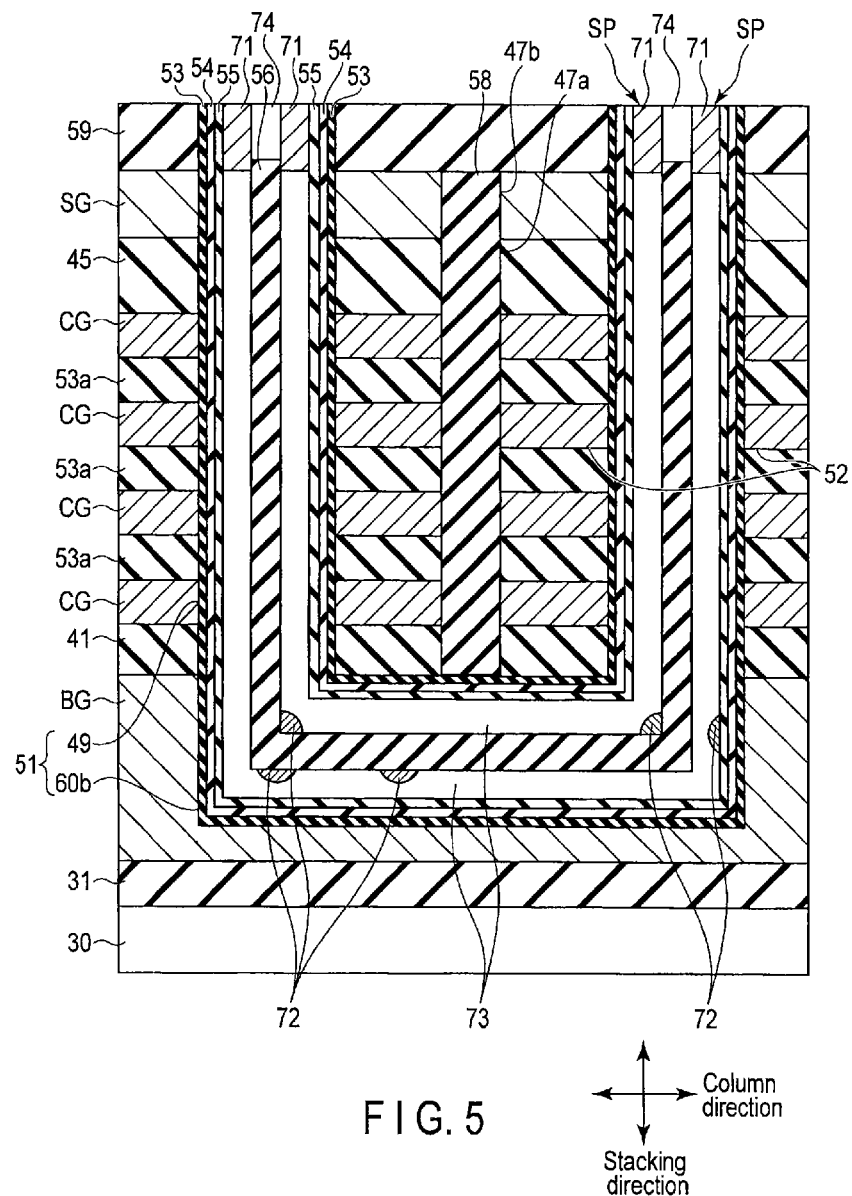
FIGS. 5, 6, and 7 are sectional views showing modifications of the first configuration example of the NAND string according to the embodiment.

As shown in FIG. 5, the undoped silicide layer 72 may also be scattered in the connecting hole 60*b* formed in the backgate BG. Although not shown, the undoped silicide layer 72 may also be scattered in the through hole 49. These scattered undoped silicide layers are formed by scattering portions (Ni silicide crystal grains) of the undoped silicide layer 72 as the growth end of the MILC process.

Figure 6:
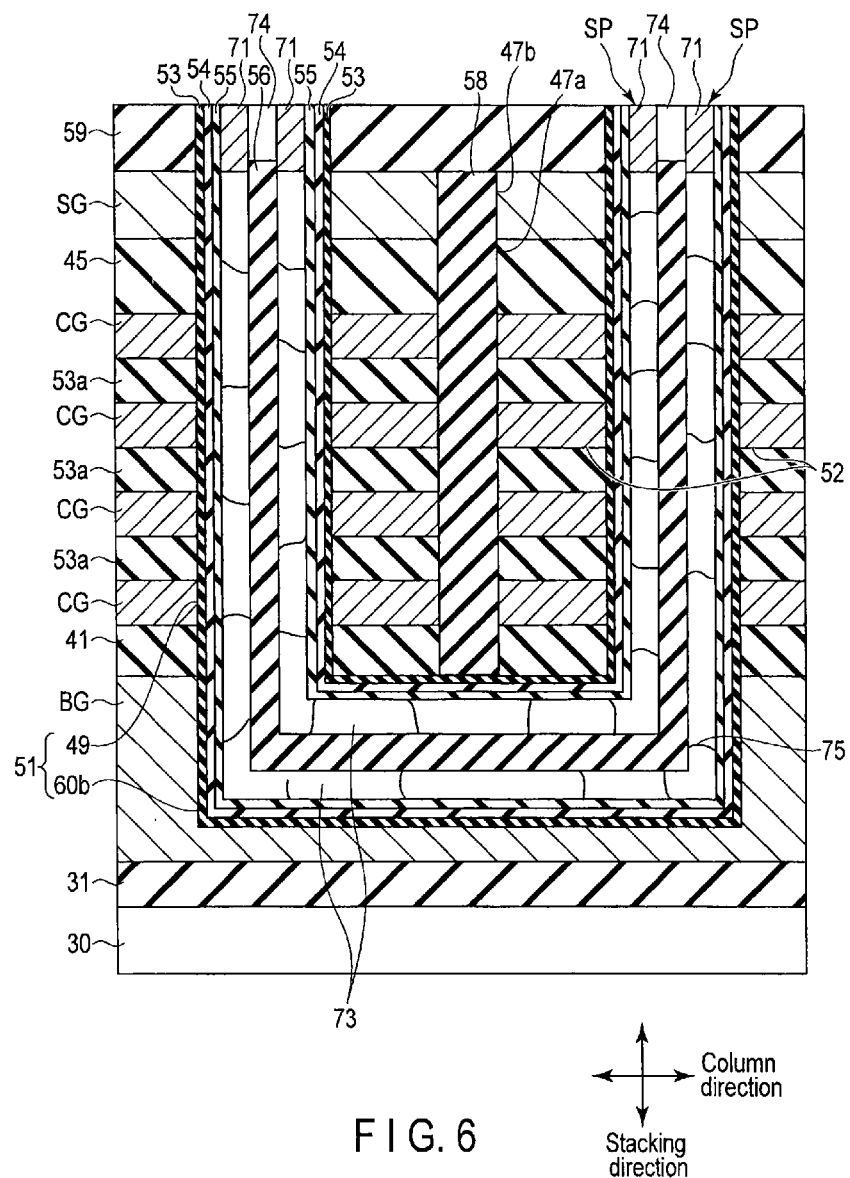

Furthermore, as shown in FIG. 6, the single-crystal silicon layer 73 is not limited to single-crystal silicon, and may also contain polycrystal silicon (polysilicon) having a large grain size. More specifically, the single-crystal silicon layer 73 may contain polysilicon having a crystal grain size equal to or larger than its thickness (the dimension between the tunnel insulating layer 55 and core layer 56). In this state, a crystal grain boundary 75 of polysilicon is formed to cross the semiconductor pillar SP. Thus, the single-crystal silicon layer 73 is crystalline silicon (single-crystal silicon and polysilicon) having a crystal grain size equal to or larger than its thickness.

Figure 7:
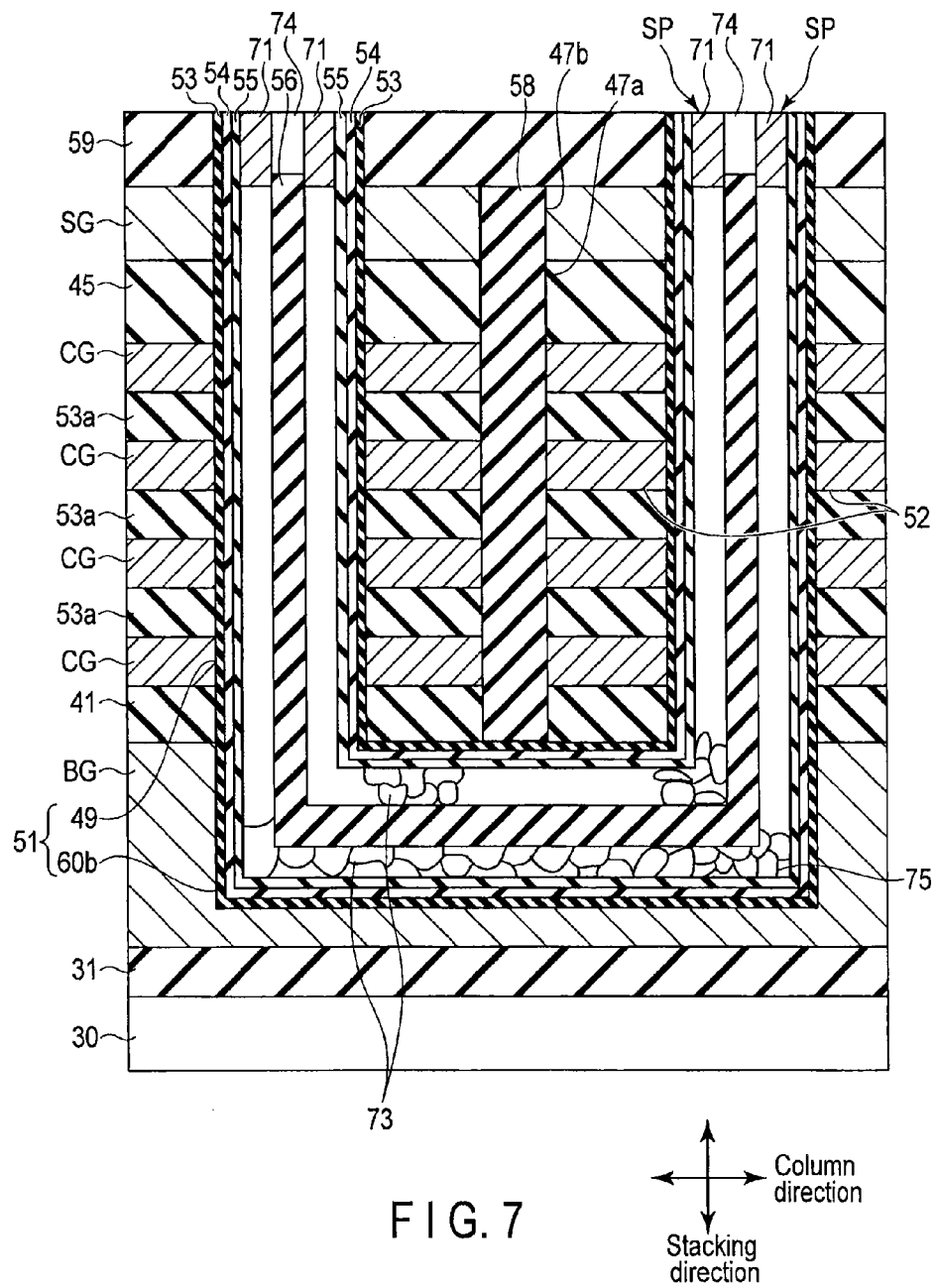

In addition, as shown in FIG. 7, the single-crystal silicon layer 73 may also contain polysilicon having a crystal grain size smaller than the thickness. In this state, the single-crystal silicon layer 73 contains polysilicon having a crystal grain size smaller than its thickness in the connecting hole 60*b* formed in the backgate BG. On the other hand, the single-crystal silicon layer 73 contains polysilicon having a crystal grain size equal to larger than the thickness and single-crystal silicon in the through hole 49 formed in the selection gate SG and control gates CG.

[Second Configuration Example of NAND String]

Next, the second configuration example of the NAND string 40 according to this embodiment will be explained with reference to FIG. 8.

Figure 8:
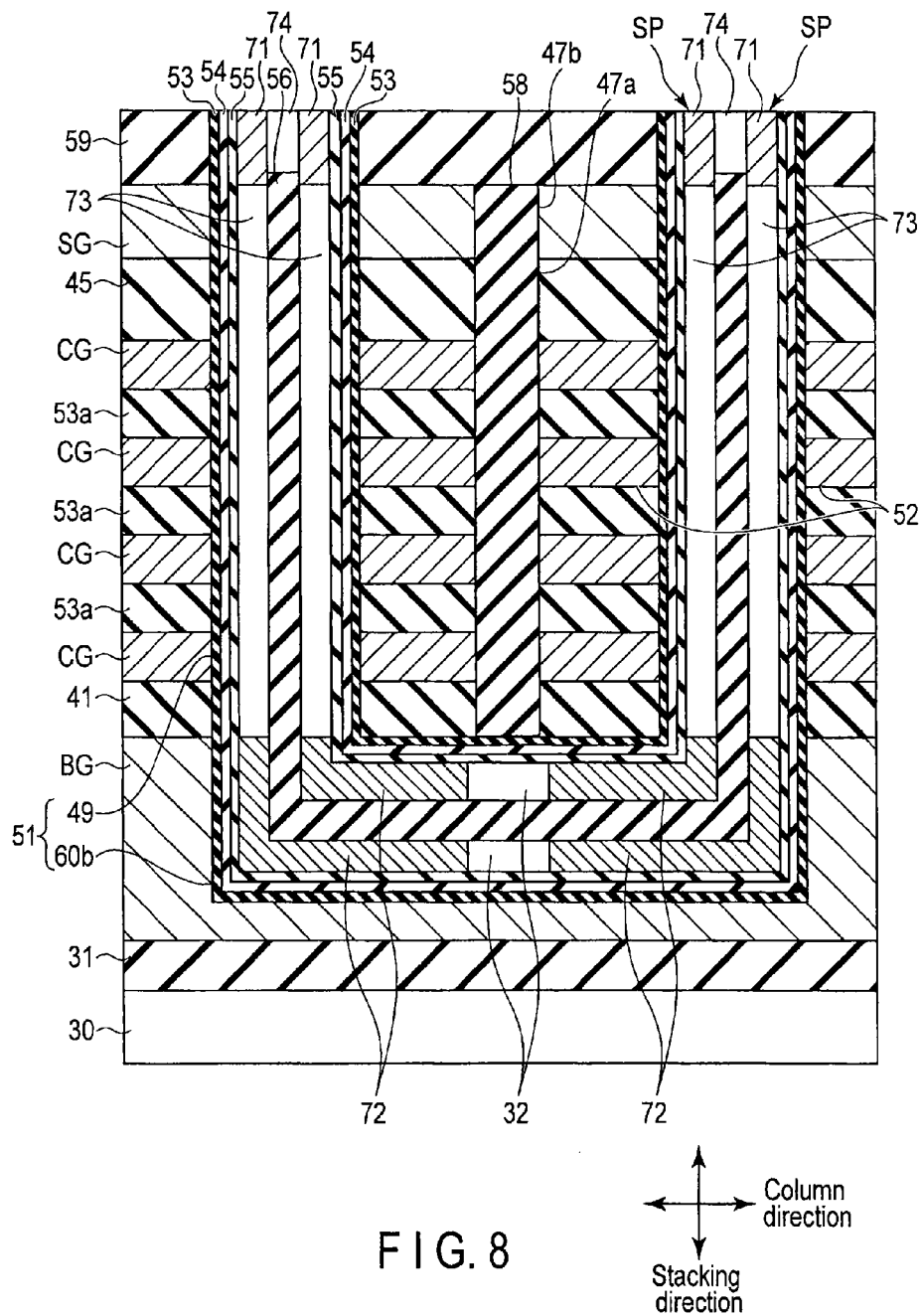
FIG. 8 is a sectional view showing the second configuration example of the NAND string according to the embodiment.

FIG. 8 is a sectional view showing the second configuration example of the NAND string 40 according to the embodiment. In the second configuration example, an explanation of the same features as those of the abovementioned first configuration example will be omitted, and differences will mainly be explained.

As shown in FIG. 8, the semiconductor pillar SP according to the second configuration example includes the doped silicide layer 71, undoped silicide layer 72, single-crystal silicon layer 73, and amorphous silicon layer 32.

The doped silicide layer 71 is formed on the tunnel insulating layer 55 in the U-shaped memory hole 51 formed in the insulating layer 59.

The single-crystal silicon layer 73 is formed on the tunnel insulating layer 55 in the U-shaped memory hole 51 formed in the selection gate SG, control gates CG, insulating layers 41 and 45, and inter-electrode insulating layers 53*a*. The end face of the single-crystal silicon layer 73 is formed in contact with the end face of the doped silicide layer 71. The single-crystal silicon layer 73 functions as the channel of the NAND string 40 (the selection transistors SDTr and SSTr and memory cell transistors MTr). The single-crystal silicon layer 73 is formed by changing the amorphous silicon layer 32 (to be described later) into a single crystal by the MILC process using the undoped silicide layer 72 (to be described later) as a catalyst.

The undoped silicide layer 72 is formed on a portion of the tunnel insulating layer 55 in the U-shaped memory hole 51 formed in the backgate BG. More specifically, the undoped silicide layer 72 is positioned in the two end portions of the connecting hole 60b in the column direction.

Furthermore, the end face of the undoped silicide layer 72 is formed in contact with the end face of the single-crystal silicon layer 73. The junction interface between the undoped silicide layer 72 and single-crystal silicon layer 73 is positioned in the connecting hole 60b, and has the same height as that of, e.g., the upper surface of the backgate BG. The undoped silicide layer 72 is a catalyst in the MILC process, and obtained by performing migration from the upper portion of the through hole 49 to the connecting hole 60b by MILC.

The amorphous silicon layer 32 is formed on a portion of the tunnel insulating layer 55 in the U-shaped memory hole 51 formed in the backgate BG. More specifically, the amorphous silicon layer 32 is positioned in a portion of the connecting hole 60b in the column direction. In the connecting hole 60b, therefore, the single-crystal silicon layer 73, undoped silicide layer 72, amorphous silicon layer 32, undoped silicide layer 72, and single-crystal silicon layer 73 are formed in this order from one through hole 49 to the other trough hole 49. The amorphous silicon layer 32 can change into the single-crystal silicon layer 73 by MILC using the undoped silicide layer 72 as a catalyst. However, the amorphous silicon layer 32 in the second configuration example has not crystallized by MILC but remains.

Note that the amorphous silicon layer 32 may also be polycrystallized in a later annealing step, instead of MILC.

[Third Configuration Example of NAND String]

The third configuration example of the NAND string 40 according to this embodiment will be explained below with reference to FIG. 9.

Figure 9:
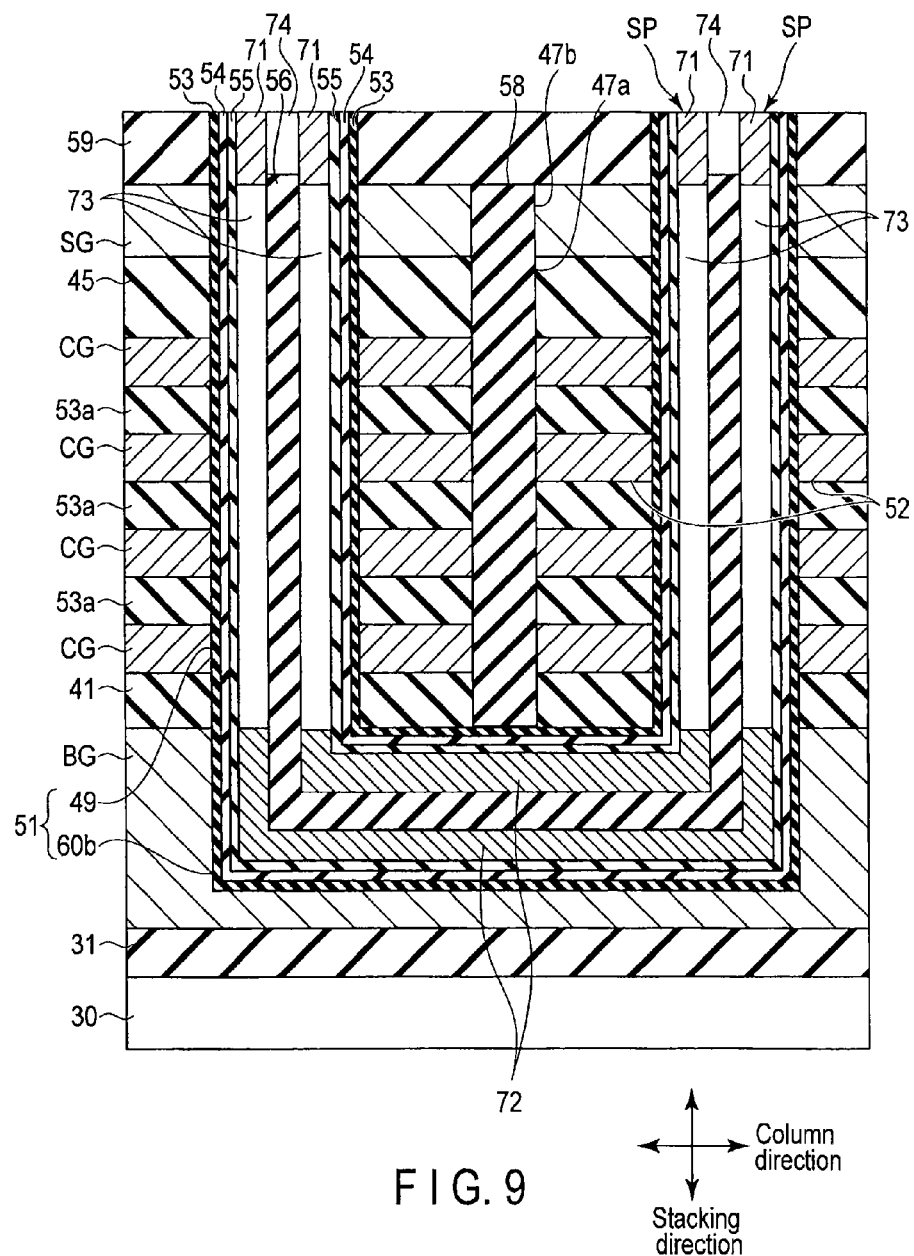
FIG. 9 is a sectional view showing the third configuration example of the NAND string according to the embodiment.

FIG. 9 is a sectional view showing the third configuration example of the NAND string 40 according to the embodiment. In the third configuration example, an explanation of the same features as those of the abovementioned first configuration example will be omitted, and differences will mainly be explained.

As shown in FIG. 9, the semiconductor pillar SP according to the third configuration example includes the doped silicide layer 71, undoped silicide layer 72, and single-crystal silicon layer 73.

The doped silicide layer 71 is formed on the tunnel insulating layer 55 in the U-shaped memory hole 51 formed in the insulating layer 59.

The single-crystal silicon layer 73 is formed on the tunnel insulating layer 55 in the U-shaped memory hole 51 formed in the selection gate SG, control gates CG, insulating layers 41 and 45, and inter-electrode insulating layers 53a. The end face of the single-crystal silicon layer 73 is formed in contact with the end face of the doped silicide layer 71. The single-crystal silicon layer 73 functions as the channel of the NAND string 40 (the selection transistors SDTr and SSTr and memory cell transistors MTr). The single-crystal silicon layer 73 is formed by changing the amorphous silicon layer 32 into a single crystal by the MILC process using the undoped silicide layer 72 as a catalyst.

The undoped silicide layer 72 is formed on a portion of the tunnel insulating layer 55 in the U-shaped memory hole 51 formed in the backgate BG. More specifically, the undoped silicide layer 72 is positioned on the entire surface of the tunnel insulating layer 55 in the connecting hole 60b. In other words, the undoped silicide layer 72 is buried as the semiconductor pillar SP in the connecting hole 60b.

Furthermore, the end face of the undoped silicide layer 72 is formed in contact with the end face of the single-crystal silicon layer 73. The junction interface between the undoped silicide layer 72 and single-crystal silicon layer 73 is positioned in the connecting hole 60b, and has the same height as that of, e.g., the upper surface of the backgate BG. The undoped silicide layer 72 is a catalyst in the MILC process, and obtained by performing migration from the upper portion of the through hole 49 to the connecting hole 60b by MILC.

[Fourth Configuration Example of NAND String]

The fourth configuration example of the NAND string 40 according to this embodiment will be explained below with reference to FIG. 10.

FIG. 10 is a sectional view showing the fourth configuration example of the NAND string 40 according to the embodiment. In the fourth configuration example, an explanation of the same features as those of the abovementioned first configuration example will be omitted, and differences will mainly be explained.

As shown in FIG. 10, the semiconductor pillar SP according to the fourth configuration example includes the doped silicide layer 71, undoped silicide layer 72, and single-crystal silicon layer 73. Also, the lowermost control gate CG of the plurality of control gates CG is a dummy control gate DCG.

The doped silicide layer 71 is formed on the tunnel insulating layer 55 in the U-shaped memory hole 51 formed in the insulating layer 59.

The single-crystal silicon layer 73 is formed on the tunnel insulating layer 55 in the U-shaped memory hole 51 formed in the selection gate SG, control gates CG, insulating layer 45, and inter-electrode insulating layers 53a. The single-crystal silicon layer 73 is also formed on a portion of the tunnel insulating layer 55 in the U-shaped memory hole 51 formed in the dummy control gate DCG. The end face of the single-crystal silicon layer 73 is formed in contact with the end face of the doped silicide layer 71. The single-crystal silicon layer 73 functions as the channel of the NAND string 40 (the selection transistors SDTr and SSTr and memory cell transistors MTr). The single-crystal silicon layer 73 is formed by changing the amorphous silicon layer 32 into a single crystal by the MILC process using the undoped silicide layer 72 as a catalyst.

The undoped silicide layer 72 is formed on a portion of the tunnel insulating layer 55 in the U-shaped memory hole 51 formed in the insulating layer 41 and backgate BG. The undoped silicide layer 72 is also formed on a portion of the tunnel insulating layer 55 in the U-shaped memory hole 51 formed in the dummy control gate DCG.

Furthermore, the end face of the undoped silicide layer 72 is formed in contact with the end face of the single-crystal silicon layer 73. The junction interface between the undoped silicide layer 72 and single-crystal silicon layer 73 is positioned in the through hole 49 formed in the dummy control gate DCG.

Since the dummy control gate DCG (a dummy memory cell transistor) is a cell that stores no data, it is unnecessary to take account of the electrical influence of the undoped silicide layer 72 on the dummy memory cell transistor. That is, the thickness of the dummy control gate DCG can be used as a margin of the formation region of the junction interface between the undoped silicide layer 72 and single-crystal silicon layer 73.

Note that when the undoped silicide layer 72 is buried as the semiconductor pillar SP in the connecting hole 60b as shown in the third and fourth configuration examples, the backgate transistor BGTr does not function as a transistor and is normally ON. In this case, the backgate BG can be formed by an insulating layer instead of a conductive layer.

[First Manufacturing Method]

The first manufacturing method of the nonvolatile semiconductor memory device according to this embodiment will now be explained with reference to FIGS. 11, 12, 13, 14, 15, 16, 17, 18, 19, and 20.

FIGS. 11, 12, 13, 14, 15, 16, 17, 18, and 19 are sectional views showing the first manufacturing process of the nonvolatile semiconductor memory device (NAND string 40) according to this embodiment. FIG. 20 is a view showing portions of the nonvolatile semiconductor memory device manufacturing process according to the embodiment in more detail. More specifically, (a) in FIG. 20 shows a step shown in FIG. 17 in more detail, (b) in FIG. 20 shows a step shown in FIG. 18 in more detail, and (c) in FIG. 20 shows a step shown in FIG. 19 in more detail.

First, as shown in FIG. 11, an insulating layer 31 made of, e.g., silicon oxide is formed on a semiconductor substrate 30. A backgate BG is formed on the insulating layer 31. The backgate BG is formed by a doped silicon layer in which an impurity (e.g., P) is doped.

A trench 60a is formed in the backgate BG by photolithography and etching. The trench 60a extends in the column direction, and functions as a connecting hole 60b (to be described later) in a later step. Also, a plurality of trenches 60a are arranged in a matrix in a plane along the row and column directions.

Then, an undoped silicon layer in which no impurity is doped is formed on the entire surface. After that, the undoped silicon layer is removed from the upper surface of the backgate BG outside the trench 60a, and left behind in only the trench 60a. Consequently, a first sacrificial layer 60 filling the trench 60a is formed by the undoped silicon layer.

Figure 12:
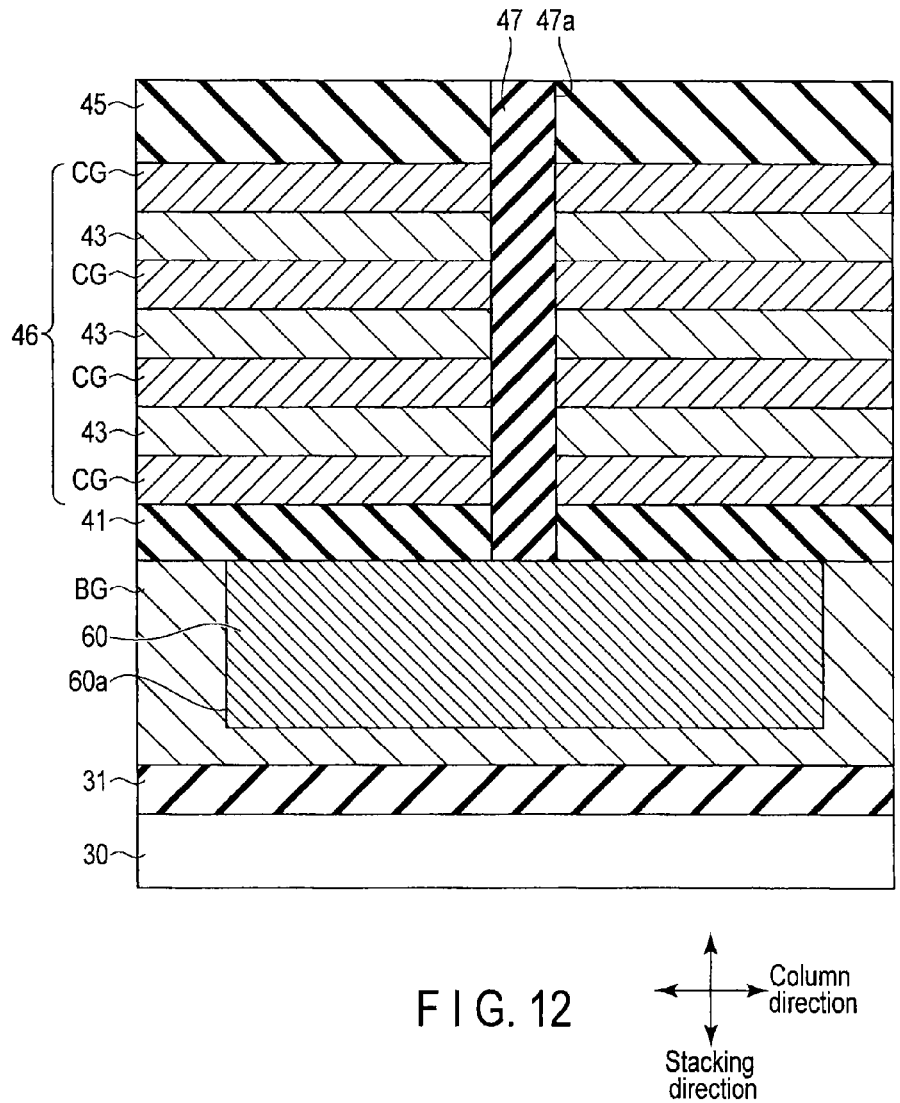

Subsequently, as shown in FIG. 12, an insulating layer 41 made of, e.g., silicon oxide is formed on the backgate BG in which the first sacrificial layer 60 is formed. On the insulating layer 41, a stack 46 in which second sacrificial layers 43 and control gates CG are alternately stacked is formed. The control gate CG is formed by a doped silicon (p-type polysilicon) layer in which an impurity (e.g., B) is doped, and the second sacrificial layer 43 is formed by an undoped silicon layer in which no impurity is doped. The second sacrificial layers 43 are replaced with inter-electrode insulating layers 53a in a later step.

Note that it is also possible to alternately stack inter-electrode insulating layers made of, e.g., silicon oxide, instead of the second sacrificial layers 43, and the control gates CG. This obviates the need to replace the sacrificial layers with the inter-electrode insulating layers in a later step.

Note also that FIG. 12 shows an example in which four control gates CG and three second sacrificial layers 43 are stacked, but the numbers of layers to be stacked are not limited to these numbers.

After that, an insulating layer 45 made of, e.g., silicon oxide is formed on the uppermost control gate CG.

Then, a slit 47a is formed in the insulating layers 41 and 45 and stack 46 by photolithography and etching. The slit 47a is formed through the insulating layers 41 and 45 and stack 46 along the row direction (backward on the drawing surface of FIG. 12). That is, the slit 47a is formed to expand in the row direction and stacking direction, and divides the insulating layers 41 and 45 and stack 46. In addition, the slit 47a is formed to be positioned above the central portion of the first sacrificial layer 60 in the column direction.

Subsequently, an insulating material 58 made of, e.g., silicon nitride is buried in the slit 47a. More specifically, the insulating material 58 is formed on the entire surface until the slit 47a is filled, and removed from the upper surface of the insulating layer 45. Consequently, the insulating material 58 remains in the slit 47a, i.e., the insulating material 58 expanding in the row direction and stacking direction is formed.

As shown in FIG. 13, a selection gate SG (a drain-side selection gate SGD and source-side selection gate SGS) is formed on the insulating layer 45. The selection gate SG is made of a doped silicon (e.g., p-type polysilicon) layer in which an impurity (e.g., B) is doped. After that, an insulating layer 59 is formed on the selection gate SG.

Then, a pair of through holes 49 are formed in the selection gate SG, stack 46, and insulating layers 41, 45, and 59. The pair of through holes 49 are so formed as to reach the two end portions of the first sacrificial layer 60 in the column direction. Consequently, the selection gate SG, stack 46, insulating layers 41, 45, and 59, and first sacrificial layer 60 are exposed to the through holes 49.

When viewed in the stacking direction, each through hole 49 is formed into, e.g., a circular shape. Also, the pair of through holes 49 are juxtaposed in the column direction, and extend in the stacking direction in the selection gate SG, stack 46, and insulating layers 41, 45, and 59.

As shown in FIG. 14, wet etching is performed through the through holes 49. This wet etching is performed using, e.g., an alkaline etching solution. The second sacrificial layers 43 in the stack 46 are removed by this wet etching. As a consequence, a gap 52 is formed between two control gates CG adjacent to each other in the stacking direction, and the sacrificial material 47 is exposed to the gap 52.

The first sacrificial layer 60 is also removed at the same time. Consequently, a connecting hole 60b (the trench 60a) extending in the column direction and connecting the lower ends of the pair of through holes 49 is formed in the backgate BG. That is, a U-shaped memory hole 51 including the pair of through holes 49 and connecting hole 60b is formed in the selection gate SG, stack 46, insulating layers 41, 45, and 59, and backgate BG.

In this step, a high etching selectivity can be achieved between the selection gate SG, control gates CG, and backgate BG made of doped silicon layers, and the first sacrificial layer 60 and second sacrificial layers 43 made of undoped silicon layers, by properly selecting the etching solution. Accordingly, the selection gate SG, control gates CG, and backgate BG made of doped silicon layers are almost not etched and remain. In this structure, the control gates CG are supported by the insulating material 58.

Figure 15:
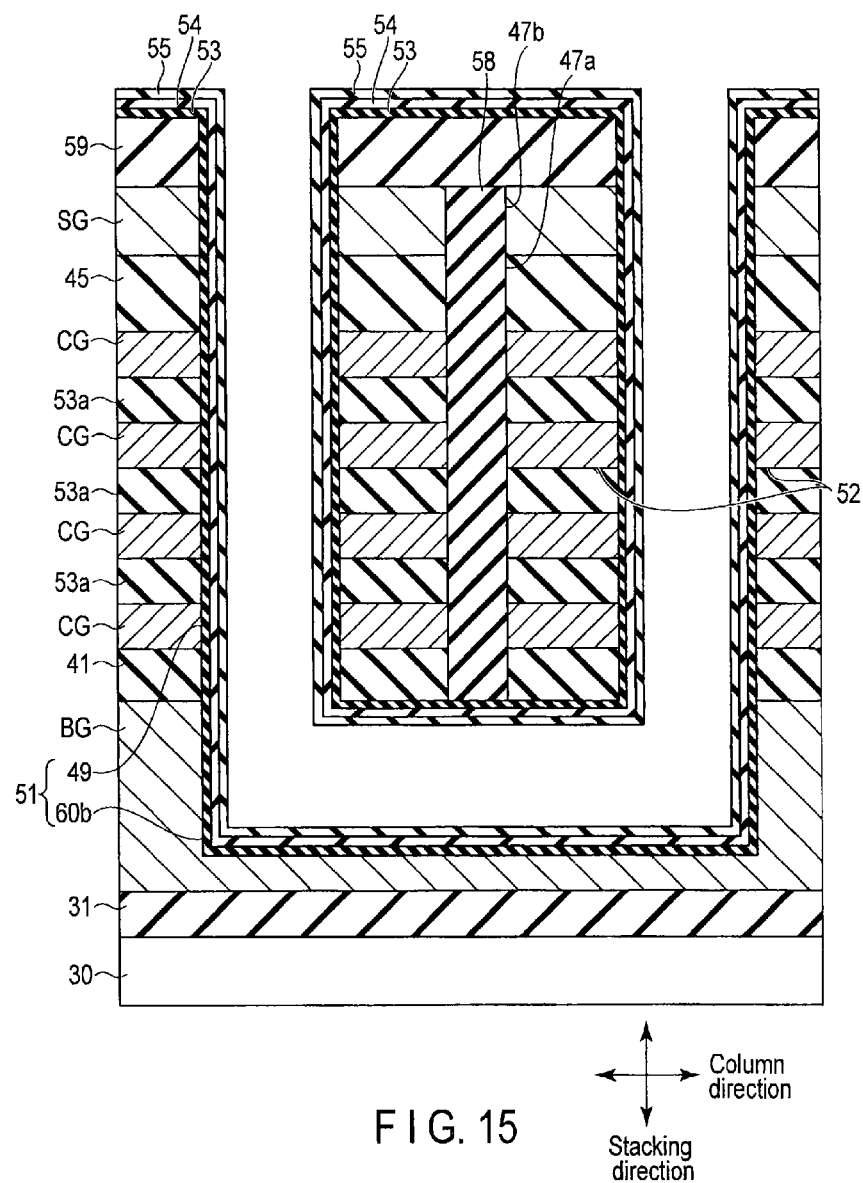

As shown in FIG. 15, a block insulating layer 53 is formed on the inner surfaces of the U-shaped memory hole 51 by, e.g., ALD (Atomic Layer Deposition) or CVD (Chemical Vapor Deposition). That is, the block insulating layer 53 is formed on the selection gate SG, control gates CG, back gate BG, and insulating layers 41, 45, and 59 exposed to the U-shaped memory hole 51. The block insulating layer 53 is an insulating layer made of, e.g., silicon oxide or silicon nitride, or has a multilayered structure of silicon oxide and silicon nitride.

In this step, the block insulating layer 53 is also formed on the inner surfaces of the gaps 52 through the through holes 49. That is, the block insulating layer 53 is also formed on the control gates CG and insulating material 58 exposed to the gaps 52. Consequently, inter-electrode insulating layers 53a integrated with the block insulating layer 53 are buried in the gaps 52. Furthermore, the block insulating layer 53 is formed on (the upper surface of) the insulating layer 59 outside the U-shaped memory hole 51.

Then, a charge storage layer 54 is formed on the block insulating layer 53 in the U-shaped memory hole 51 by, e.g., ALD or CVD. The charge storage layer 54 is also formed on the block insulating layer 53 outside the U-shaped memory hole 51. The charge storage layer 54 is an insulating layer made of, e.g., silicon oxide or silicon nitride.

Subsequently, a tunnel insulating layer 55 is formed on the charge storage layer 54 in the U-shaped memory hole 51 by, e.g., ALD or CVD. The tunnel insulating layer 55 is also formed on the charge storage layer 54 outside the U-shaped memory hole 51. The tunnel insulating layer 55 is an insulating layer made of, e.g., silicon oxide or silicon nitride.

Figure 16:
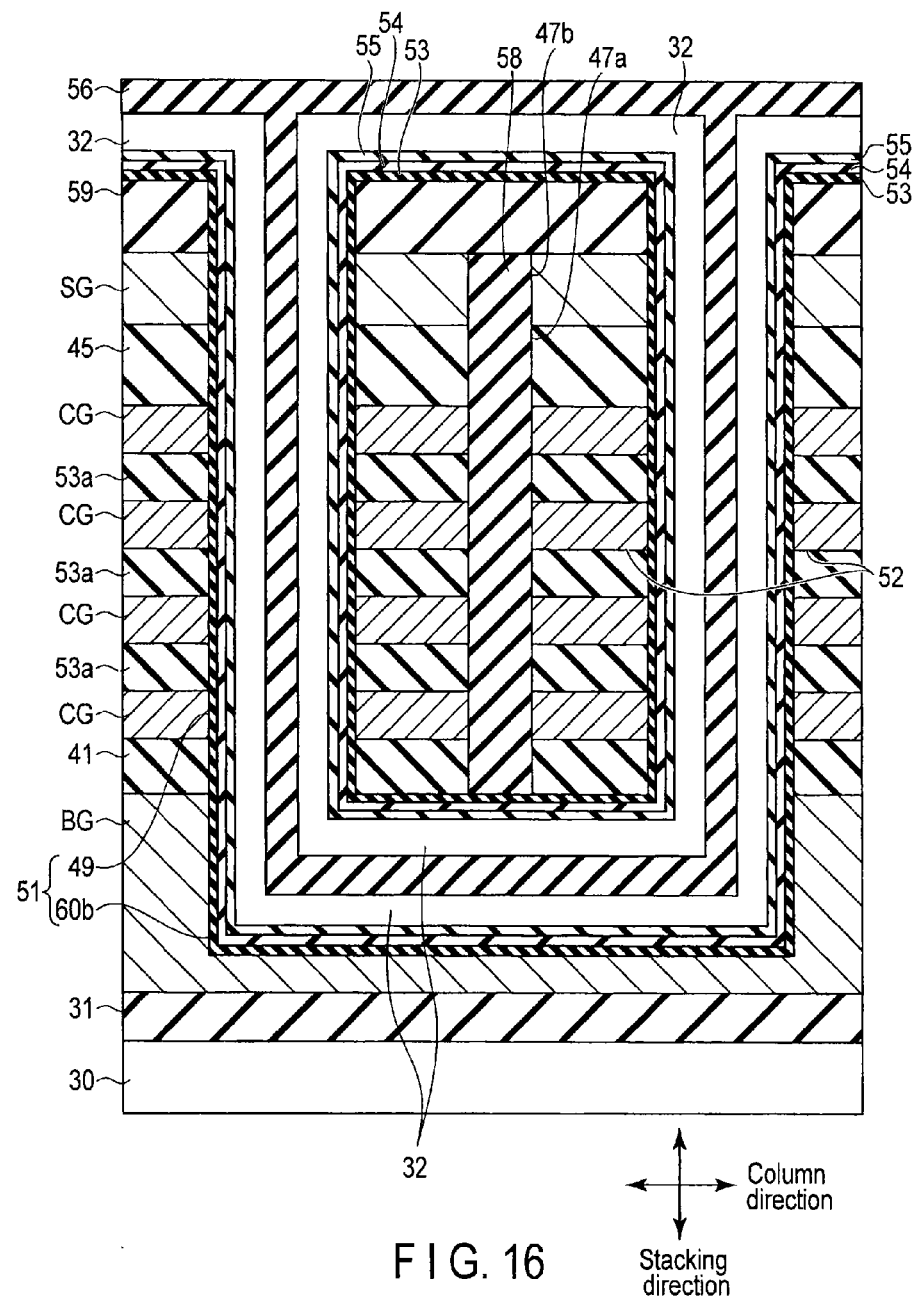

As shown in FIG. 16, an amorphous silicon layer 32 is formed as a semiconductor pillar SP on the tunnel insulating layer 55 in the U-shaped memory hole 51 by, e.g., ALD or CVD. The amorphous silicon layer 32 is also formed on the charge storage layer 55 outside the U-shaped memory hole 51.

After that, a core layer 56 is formed on the amorphous silicon layer 32 in the U-shaped memory hole 51 by, e.g., ALD or CVD, at a deposition temperature at which the amorphous silicon layer 32 does not crystallize. The core layer 56 is also formed on the amorphous silicon layer 32 outside the U-shaped memory hole 51. The core layer 56 is formed by an insulating layer made of, e.g., silicon oxide, and filled in the U-shaped memory hole 51.

Note that the core layer 56 functions as a mask of ion implantation (to be described later) for the amorphous silicon layer 32. Therefore, the core layer 56 may be removed after the ion implantation. That is, the core layer 56 may also be formed as a sacrificial layer.

Figure 17:
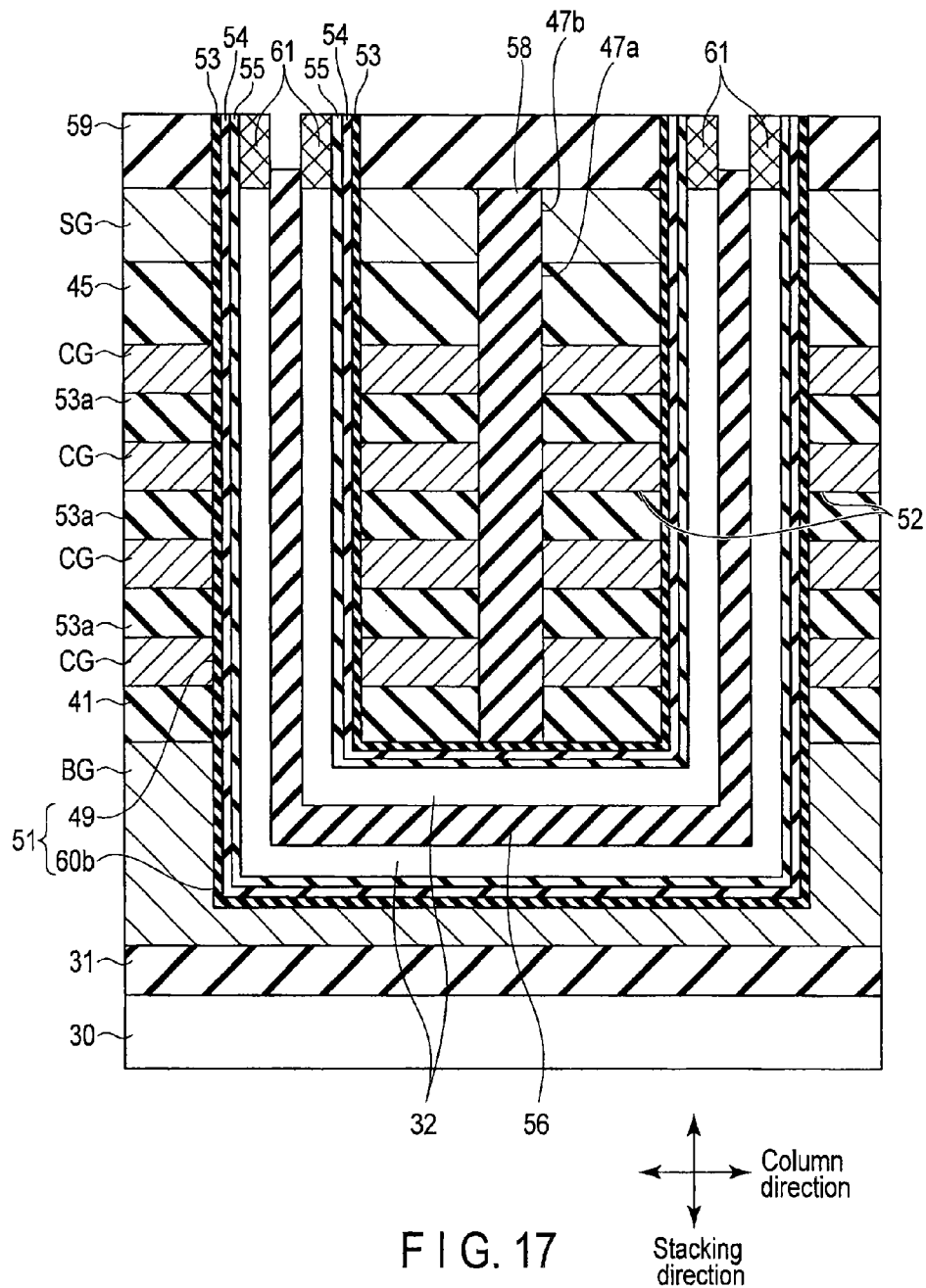

As shown in FIG. 17, the core layer 56 formed outside the U-shaped memory hole 51 is removed by dry etching such as RIE (Reactive Ion Etching). In this step, the level of the upper surface of the core layer 56 is set equal to, desirably, higher than that of the upper surface of the selection gate SG.

Then, the amorphous silicon layer 32 formed outside the U-shaped memory hole 51 is removed by dry etching such as RIE. In this step, the level of the upper surface of the amorphous layer 32 is set higher than that of the upper surface of the core layer 56.

Subsequently, the tunnel insulating layer 55, charge storage layer 54, and block insulating layer 53 formed outside the U-shaped memory hole 51 are removed by dry etching such as RIE.

After that, the core layer 56 is used as a mask to implant P into the amorphous silicon layer 32 by ion implantation. Consequently, doped amorphous silicon layers 61 are formed on the upper end portions of the amorphous silicon layer 32.

More specifically, as indicated by (a) in FIG. 20, the level of the lower surface of the doped amorphous silicon layer 61 (the junction interface between the doped amorphous silicon layer 61 (P-doped a-Si) and amorphous silicon layer 32 (intrinsic Si)) is set equal to or higher than that of the upper surface of the selection gate SG. Therefore, the selection gate SG and doped amorphous silicon layer 61 do not overlap each other.

The migration of Ni disilicide by MILC can be suppressed by increasing the P concentration in amorphous silicon. The P concentration in the doped amorphous silicon layer 61 is a concentration at which silicidation occurs but the migration of Ni disilicide by MILC does not occur. For example, the P concentration in the doped amorphous silicon layer 61 is $1 \times 10^{20}$ [atoms/cc] or more. On the other hand, the P concentration in the amorphous silicon layer 32 is lower than that in the doped amorphous silicon layer 61, and is a P concentration at which silicidation and the migration of Ni disilicide by MILC occur. That is, the interface between a region where silicidation occurs but the migration of Ni disilicide by MILC does not occur and a region where silicidation and the migration of Ni disilicide by MILC occur is positioned on the same level as that of the upper surface of the selection gate SG.

Note that the junction interface between the doped amorphous silicon layer 61 and amorphous silicon layer 32 can be lower than the upper surface of the selection gate SG, provided that selection transistors SDTr and SDTr to be formed in a later step function as transistors. The region and impurity concentration of the doped amorphous silicon layer 61 can be adjusted by changing the acceleration energy, dose, and implantation angle of ion implantation. It is also possible to dope As or B instead of P.

Then, as shown in FIG. 18, a metal layer 62 is formed to cover the entire surface by, e.g., PVD (Physical Vapor Deposition) or MO (Metal Organic)-CVD. The metal layer 62 is formed in contact with the upper surface of the doped amorphous silicon layer 61. The metal layer 62 is made of, e.g., Ni, but the material is not limited to this. The metal layer 62 need only be made of a metal element that forms silicide together with Si, and may be made of Co or Y.

Subsequently, silicidation annealing, e.g., RTA (Rapid Thermal Annealing) is performed on the metal layer 62, doped amorphous silicon layer 61, and amorphous silicon layer 32 at 350° C. to 600° C. Consequently, the doped amorphous silicon layer 61 is silicided to form a doped silicide layer 71. Also, the upper end portion of the amorphous silicon layer 32 is partially silicided to form an undoped silicide layer 72.

More specifically, as indicated by (b) in FIG. 20, the level of the lower surface of the doped silicide layer 71 (the junction interface between the doped silicide layer 71 (P-doped $NiSi_2$) and undoped silicide layer 72 ($NiSi_2$)) is set equal to or higher than that of the upper surface of the selection gate SG. Also, the lower surface of the undoped silicide layer 72 (the junction interface between the undoped silicide layer 72 and amorphous silicon layer 32) is set lower than the upper surface of the selection gate SG. That is, the selection gate SG and doped silicide layer 71 do not overlap each other, but the selection gate SG and undoped silicide layer 72 overlap each other.

Note that the silicidation annealing temperature is a temperature at which disilicidation occurs but MILC does not occur. More specifically, no disilicidation occurs when the temperature of RTA is 350° C. or less. Also, single crystal formation by MILC occurs when the temperature of RTA is 550° C. or more. Note that the Ni—Si composition formed by the abovementioned silicidation annealing depends on the thickness of the amorphous silicon layer 32.

In addition, the amount (thickness) of the undoped silicide layer 72 to be formed on a part of the upper end portion of the amorphous silicon layer 32 is determined by adjusting the time and temperature of RTA. To improve the conduction state in the backgate BG later, it is desirable to increase the formation amount of the undoped silicide layer 72 to such an extent that the amount falls within the range of the backgate BG.

Figure 19:
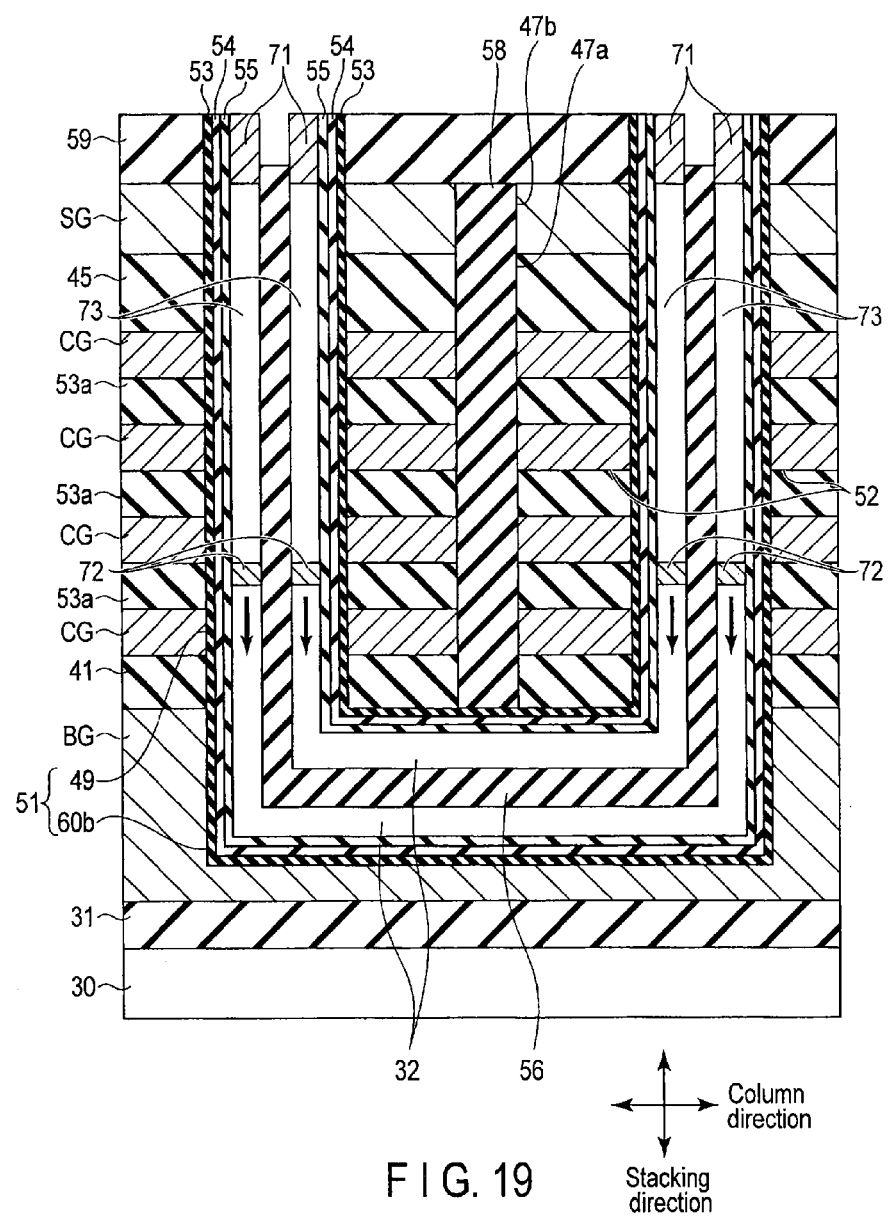
Figure 20:
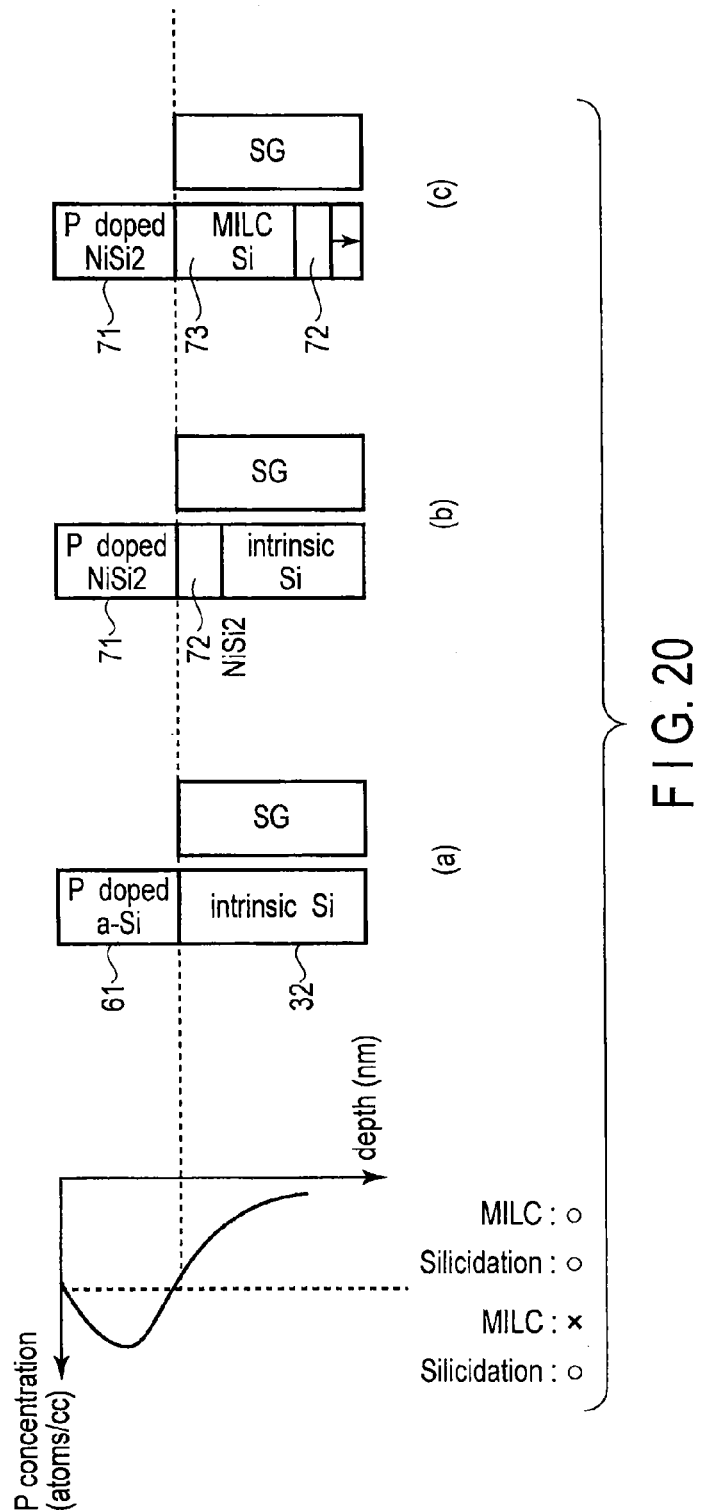
FIG. 20 is a view showing a part of the first manufacturing process of the nonvolatile semiconductor memory device according to the embodiment in more detail.

Then, as shown in FIG. 19, an excessive metal layer 62 not having contributed to the silicidation reaction is removed by wet etching using, e.g., a sulfuric acid-hydrogen peroxide solution (a solution mixture of sulfuric acid and a hydrogen peroxide solution).

After that, annealing is performed on the undoped silicide layer 72 and amorphous silicon layer 32 at a temperature from 500° C. to a temperature at which the amorphous silicon layer 32 does not crystallize, e.g., 750° C. As a consequence, the MILC of the amorphous silicon layer 32 occurs by using the undoped silicide layer 72 as a catalyst. More specifically, the undoped silicide layer 72 migrates into the amorphous silicon layer 32. Consequently, the amorphous silicon layer 32 through which the undoped silicide layer 72 passes changes into a single crystal, thereby forming a single-crystal silicon layer 73 (MILC Si). The crystal orientation of the single-crystal silicon layer 73 is the same as or almost the same as that of the undoped silicide layer 72.

As indicated by (c) in FIG. 20, the doped silicide layer 71 contains P to such an extent that no migration of Ni disilicide by MILC occurs. On the other hand, the undoped silicide layer 72 contains P to such an extent that the migration of Ni disilicide by MILC occurs, or contains no P. Even when performing annealing, therefore, the doped silicide layer 71 does not migrate, and only the undoped silicide layer 72 migrates into the amorphous silicon layer 32 and changes the amorphous silicon layer 32 into a single crystal.

Note that the temperature and time of annealing are a temperature and time by which MILC occurs but no poly-crystallization (polysilicon formation) occurs. More specifically, neither polycrystallization nor MILC occurs when the annealing temperature is 450° C. or less and the annealing time is 2 hrs or less. Also, when the thickness of the amorphous silicon layer 32 is, e.g., 10 nm, the polycrystallization of the amorphous silicon layer 32 occurs if the annealing temperature is 750° C. or more and the annealing time is 30 min or more.

Furthermore, annealing is performed until the undoped silicide layer 72 migrates into the backgate BG. In this step, the layout of the single-crystal silicon layer 73, undoped silicide layer 72, and amorphous silicon layer 32 in the connecting hole 60b is determined in accordance with the end timing of annealing.

Then, as shown in FIG. 3, contacts 74 made of a conductive layer are formed to fill the U-shaped memory hole 51. The contacts 74 are formed in contact with the doped silicide layer 71. In addition, a source line SL (not shown) and bit line BL (not shown) to be electrically connected to the contacts 74 are formed.

Note that the core layer 56 may also be hollowed before the contacts 74 are formed. In this case, the contacts 74 are desirably formed by a low-coverage method so as not to fill the hollow of the core layer 56.

Thus, the nonvolatile semiconductor memory device is formed by the first manufacturing method according to this embodiment.

[Second Manufacturing Method]

The second manufacturing method of the nonvolatile semiconductor memory device according to this embodiment will be explained below with reference to FIGS. 21, 22, 23, and 24.

FIGS. 21, 22, 23, and 24 are sectional views showing the second manufacturing process of the nonvolatile semiconductor memory device (NAND string 40) according to this embodiment. In the second manufacturing method, an explanation of the same features as those of the abovementioned first manufacturing method will be omitted, and differences will mainly be explained.

First, the steps shown in FIGS. 11, 12, 13, 14, 15, and 16 of the first manufacturing method are performed. That is, a block insulating layer 53, charge storage layer 54, tunnel insulating layer 55, amorphous silicon layer 32, and core layer 56 are formed in this order on the inner surfaces of a U-shaped memory hole 51. Consequently, the U-shaped memory hole 51 is filled. The block insulating layer 53, charge storage layer 54, tunnel insulating layer 55, amorphous silicon layer 32, and core layer 56 are also formed outside the U-shaped memory hole 51.

Then, as shown in FIG. 21, the core layer 56 formed outside the U-shaped memory hole 51 is removed by dry etching such as RIE. In this step, the height of the upper surface of the core layer 56 is set equal to that of the upper surface of a selection gate SG.

Subsequently, the amorphous silicon layer 32 formed outside the U-shaped memory hole 51 is removed by dry etching such as RIE. In this step, the height of the upper surface of the amorphous silicon layer 32 is set equal to that of the upper surfaces of the core layer 56 and selection gate SG.

After that, the tunnel insulating layer 55, charge storage layer 54, and block insulating layer 53 formed outside the U-shaped memory hole 51 are removed by dry etching such as RIE.

As shown in FIG. 22, a doped amorphous silicon layer 61 in which, e.g., P is doped is formed on the entire surface by a deposition method such as CVD. The P concentration in the doped amorphous silicon layer 61 is a concentration at which silicidation occurs but the migration of Ni disilicide by MILC does not occur. For example, the P concentration in the doped amorphous silicon layer 61 is $1 \times 10^{20}$ [atoms/cc] or more.

After that, the doped amorphous silicon layer 61 is etched back by, e.g., RIE. Consequently, the doped amorphous silicon layer 61 formed outside the U-shaped memory hole 51 is removed, and the doped amorphous silicon layer 61 remains in the U-shaped memory hole 51. More specifically, the doped amorphous silicon layer 61 is formed on the core layer 56, amorphous silicon layer 32, and tunnel insulating layer 55 in the U-shaped memory hole 51.

Then, a metal layer 62 is formed to cover the entire surface by, e.g., PVD. The metal layer 62 is formed in contact with the upper surface of the doped amorphous silicon layer 61.

Subsequently, as shown in FIG. 23, silicidation annealing, e.g., RTA is performed on the metal layer 62, doped amorphous silicon layer 61, and amorphous silicon layer 32 at 350° C. to 600° C. Consequently, the doped amorphous silicon layer 61 is silicided to form a doped silicide layer 71. Also, the upper end portion of the amorphous silicon layer 32 is partially silicided to form an undoped silicide layer 72.

Figure 24:
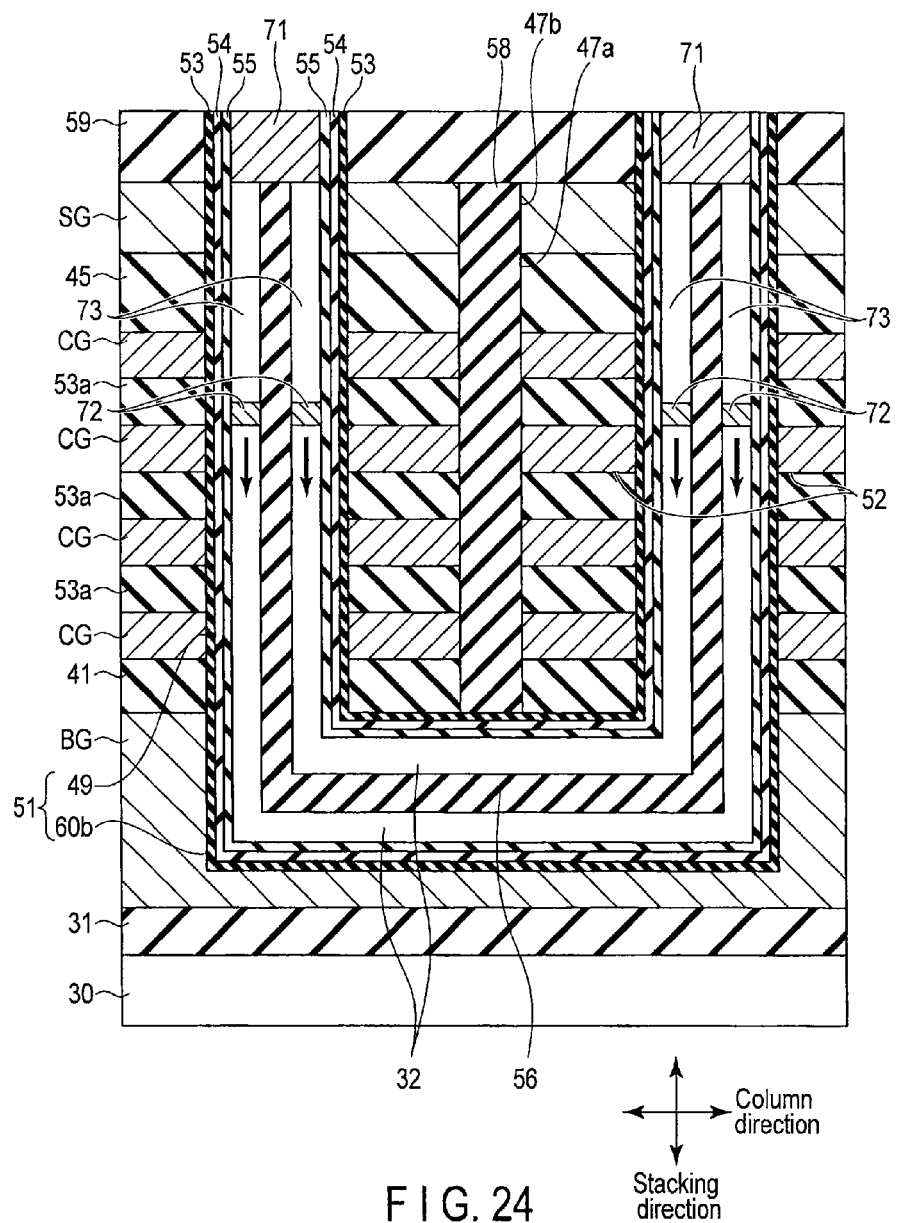

As shown in FIG. 24, an excessive metal layer 62 not having contributed to the silicidation reaction is removed by wet etching using, e.g., a sulfuric acid-hydrogen peroxide solution (a solution mixture of sulfuric acid and a hydrogen peroxide solution).

After that, annealing is performed on the undoped silicide layer 72 and amorphous silicon layer 32 at a temperature from 500° C. to a temperature at which the amorphous silicon layer 32 does not crystallize, e.g., 750° C. As a consequence, the MILC of the amorphous silicon layer 32 occurs by using the undoped silicide layer 72 as a catalyst. More specifically, the undoped silicide layer 72 migrates into the amorphous silicon layer 32. Consequently, the amorphous silicon layer 32 through which the undoped silicide layer 72 passes changes into a single crystal, thereby forming a single-crystal silicon layer 73 (MILC Si). The crystal orientation of the single-crystal silicon layer 73 is the same as or almost the same as that of the undoped silicide layer 72.

Then, as shown in FIG. 3, the tunnel insulating layer 55, charge storage layer 54, and block insulating layer 53 formed outside the U-shaped memory hole 51 are removed by, e.g., RIE. After that, contacts 74 made of a conductive layer are formed to fill the U-shaped memory hole 51. The contacts 74 are formed in contact with the doped silicide layer 71. In addition, a source line SL (not shown) and bit line BL (not shown) to be electrically connected to the contacts 74 are formed.

Thus, the nonvolatile semiconductor memory device is formed by the second manufacturing method according to this embodiment.

[Effects]

In this embodiment described above, in the semiconductor pillar SP, the diffusion layers of the selection transistor SG are formed by the doped silicide layer 71, and the channel layer of the NAND string 40 is formed by the single-crystal silicon layer 73. This can achieve the following effects.

FIG. 25 is a view showing the bandgap of a semiconductor pillar SP of a comparative example, and the bandgap of the semiconductor pillar SP of this embodiment. More specifically, (a) in FIG. 25 is a view showing band bending in the junction interface between the diffusion layers and channel of selection transistors SDTr and SSTr of the comparative example, and (b) in FIG. 25 is a view showing band bending in the junction interface between the diffusion layers and channel of the selection transistors SDTr and SSTr of this embodiment.

As shown in (a) of FIG. 25, in the comparative example in which the diffusion layers are formed by doped silicon layers in which P is doped and the channel is formed by an undoped silicon layer, band bending is moderate because the impurity concentration in the doped silicon/undoped silicon junction interface continuously moderately changes due to the influence of thermal diffusion. Accordingly, the source/drain voltage for erase is relaxed in the moderate junction interface, and this weakens an electric field in the junction interface and decreases a GIDL current during erase. This makes the erase characteristic insufficient.

By contrast, as shown in (b) of FIG. 25, in this embodiment in which the diffusion layers are formed by the silicided doped silicide layers 71 and the channel is formed by the single-crystal silicon layer 73, band bending in the junction interface between them can be steepened. That is, a Schottky junction can be formed as the junction between the diffusion layers and channel. When an erase voltage is applied, therefore, it is possible to increase the electric field in the junction interface and increase the GIDL current compared to the comparative example. As a consequence, the erase characteristic can be improved.

Also, in this embodiment, the diffusion layers are formed by the doped silicide layers 71 in which P is doped. The work function can be increased by doping P in silicide. This makes it possible to further steepen band bending in the junction interface between the diffusion layers and channel. That is, it is possible to further increase the GIDL current and further improve the erase characteristic.

Furthermore, in this embodiment, the channel of the NAND string 40 is formed by the single-crystal silicon layer 73 changed into a single crystal by the MILC process. This can increase the electric charge mobility in the channel when compared to a memory in which the channel is formed by a silicon layer that is not changed into a single crystal. That is, the channel current can be increased.

In addition, in this embodiment, the undoped silicide layer 72 is formed in the connecting hole 60b formed in the backgate BG. This makes it possible to decrease the ON resistance of the channel in the backgate transistor BGTr, thereby increasing the channel current.

Application Example

Next, an application example of the nonvolatile semiconductor memory device according to this embodiment will be explained with reference to FIG. 26.

FIG. 26 is a sectional view showing the application example of the NAND string 40 according to this embodiment. More specifically, FIG. 26 shows an example in which this embodiment is applied to a straight BiCS, instead of a so-called p (pipe)-BiCS.

As shown in FIG. 26, the NAND string 40 of the application example is formed above a semiconductor substrate 80, and includes a plurality of control gates CG, a source-side selection gate SGS, a drain-side selection gate SGD, a memory film (a block insulating layer 86, charge storage layer 87, and tunnel insulating layer 88), and a semiconductor pillar (a doped silicide layer 90, single-crystal silicon layer 89, and undoped silicide layer 91).

The source-side selection gate SGS is formed on an insulating layer 81 on a source line SL formed on the semiconductor substrate. The source-side selection gate SGS is formed by, e.g., a doped silicon layer in which an impurity (e.g., B) is doped. An insulating layer 82 is formed on the source-side selection gate SGS.

The plurality of control gates CG are formed on the insulating layer 82. Also, the plurality of control gates CG are formed with inter-electrode insulating layers 83 being interposed between them. In other words, the plurality of inter-electrode insulating layers 83 and the plurality of control gates CG are alternately stacked on the insulating layer 82. The control gate CG is formed by, e.g., a doped silicon layer in which an impurity (e.g., B) is doped.

The drain-side selection gate SGD is formed on an insulating layer 84 on the plurality of control gates. The drain-side selection gate SGD is formed by, e.g., a doped silicon layer in which an impurity (e.g., B) is doped. An insulating layer 85 is formed on the drain-side selection gate SGD.

An insulating layer 92 is formed on the insulating layer 85, and a bit line BL is formed on the insulating layer 92.

A memory hole (not shown) is formed in the control gates CG, source-side selection gate SGS, drain-side selection gate SGD, insulating layers 81, 82, 84, and 85, and inter-electrode insulating layer 83. This memory hole is so formed as to extend in the stacking direction in the control gates CG, source-side selection gate SGS, drain-side selection gate SGD, insulating layers 81, 82, 84, and 85, and inter-electrode insulating layer 83.

The memory film includes the block insulating layer 86, charge storage layer 87, and tunnel insulating layer 88.

The block insulating layer 86 is formed on the inner surfaces of the memory hole. That is, the block insulating layer 86 is formed on the control gates CG, source-side selection transistor SGS, drain-side selection transistor SGD, insulating layers 81, 82, 84, and 85, and inter-electrode insulating layers 83 in the memory hole. The charge storage layer 87 is formed on the block insulating layer 86 in the memory hole. The tunnel insulating layer 88 is formed on the charge storage layer 87 in the memory hole.

The semiconductor pillar is formed on the tunnel insulating layer 88 in the memory hole. The semiconductor pillar functions as the channel of the NAND string 40. Details of the semiconductor pillar of this application example will be described later.

A core layer 93 is formed on the semiconductor pillar in the memory hole. The core layer 93 is formed by an insulating layer made of, e.g., silicon oxide, and filled in the memory hole. Note that it is also possible to form a hollow instead of the core layer 93, and leave the memory hole unfilled.

The semiconductor pillar and the memory film and various gates formed around the semiconductor pillar form various transistors. The NAND string 40 is formed along the semiconductor pillar by using it as a channel.

More specifically, the control gate CG, the semiconductor pillar, and the memory film formed between them form a memory cell transistor. Also, the selection gates (the drain-side selection gate SGD and source-side selection gate SGS), the semiconductor pillar SP, and the memory film formed between them form selection transistors (a drain-side selection transistor and source-side selection transistor).

The semiconductor pillar in the application example includes the doped silicide layer 90, undoped silicide layer 91, and single-crystal silicon layer 89.

The doped silicide layer 90 is formed on the tunnel insulating layer 88 in the memory hole formed in the insulating layer 85. The doped silicide layer 90 is made of, e.g., Ni disilicide ($NiSi_2$) in which P is doped. The doped silicide layer 90 functions as the diffusion layers of the drain-side selection transistor. Also, the concentration of P in the doped silicide layer 90 is, e.g., $1.0 \times 10^{20}$ [atoms/cc] or more.

The single-crystal silicon layer 89 is formed on the tunnel insulating layer 88 in the memory hole formed in the drain-side selection gate SGD, source-side selection gate SGS, control gates CG, insulating layers 82 and 84, and inter-electrode insulating layers 83. The end face of the single-crystal silicon layer 89 is formed in contact with the end face of the doped silicide layer 90. The single-crystal silicon layer 89 functions as the channel of the NAND string 40 (the drain-side selection transistor, source-side selection transistor, and memory cell transistors).

The junction interface between the doped silicide layer 90 and single-crystal silicon layer 89 is desirably higher than the upper surface of the drain-side selection gate SGD. This is so because if the junction interface between the doped silicide layer 90 and single-crystal silicon layer 89 is lower than the upper surface of the drain-side selection gate SGD, i.e., if the doped silicide layer overlaps a gate-controllable region, the transistor characteristics may deteriorate, e.g., the off-leak may rise. However, the present embodiment is not limited to this, and the junction interface between the doped silicide layer 90 and single-crystal silicon layer 89 need only be positioned within a range in which the drain-side selection transistor functions as a selection transistor of the NAND string.

The single-crystal silicon layer 89 is formed by changing amorphous silicon into a single crystal by a MILC process using the undoped silicide layer 91 (to be described later) as a catalyst. Therefore, the crystal orientation of the single-crystal silicon layer 89 is the same as or almost the same as that of the undoped silicide layer 91.

The undoped silicide layer 91 is formed on the tunnel insulating layer 88 in the memory hole formed in the insulating layer 81. The end face of the undoped silicide layer 91 is formed in contact with the end face of the single-crystal silicon layer 89. The junction interface between the undoped silicide layer 91 and single-crystal silicon layer 89 is desirably lower than the lower surface of the source-side selection gate SGS. This is so because if the junction interface between the undoped silicide layer 91 and single-crystal silicon layer 89 is higher than the lower surface of the source-side selection gate SGS, i.e., if the undoped silicide layer overlaps a gate-controllable region, the transistor characteristics may deteriorate, e.g., the off-leak may rise. However, the present embodiment is not limited to this, and the junction interface between the undoped silicide layer 91 and single-crystal silicon layer 89 need only be positioned within a range in which the source-side selection transistor functions as a selection transistor of the NAND string.

Also, the undoped silicide layer 91 is a silicide layer containing the same metal element as that of the doped silicide layer 90, and made of, e.g., Ni disilicide in which no impurity is doped. The undoped silicide layer 91 is a catalyst in the MILC process, and obtained by performing migration from the upper portion to the lower portion of the memory hole by MILC.

Note that the doped silicide layer 90, undoped silicide layer 91, and single-crystal silicon layer 89 may each contain Ge. Note also that the undoped silicide layer 91 is a silicide layer in which no impurity is doped, but the present embodiment is not limited to this, and the undoped silicide layer 91 may also contain an impurity (e.g., P) to such an extent that MILC occurs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a semiconductor substrate;
    a first layer formed above the semiconductor substrate;
    a first conductive layer formed above the first layer;
    a second conductive layer formed above the first conductive layer;
    an insulating layer formed on the second conductive layer;
    a block insulating layer formed on an inner surface of a pair of through holes formed in the insulating layer, the second conductive layer, and the first conductive layer, and extending in a stacking direction, and on an inner surface of a connecting hole formed in the first layer and configured to connect lower end portions of the pair of through holes;
    a charge storage layer formed on the block insulating layer;
    a tunnel insulating layer formed on the charge storage layer; and
    a semiconductor pillar formed on the tunnel insulating layer,
    wherein the semiconductor pillar includes a doped silicide layer which is formed in the pair of through holes formed in the insulating layer, and in which an impurity is doped, a silicon layer formed in the pair of through holes formed in the second conductive layer and the first conductive layer, and a silicide layer formed in the connecting hole formed in the first layer.

2. The device of claim 1, wherein the impurity includes P, B, or As.

3. The device of claim 1, wherein the silicon layer contains a crystalline material having a crystal grain size not less than a film thickness.

4. The device of claim 1, wherein a crystal orientation of the silicon layer is the same as or substantially the same as that of the silicide layer.

5. The device of claim 1, wherein the doped silicide layer and the silicide layer contain disilicide.

6. The device of claim 1, wherein the silicide layer comprises an undoped silicide layer.

7. The device of claim 1, wherein the semiconductor pillar further includes an amorphous silicon layer formed in the connecting hole formed in the first layer.

8. The device of claim 1, wherein a junction interface between the silicon layer and the silicide layer is lower than an upper surface of the first layer.

9. The device of claim 1, wherein a junction interface between the silicon layer and the silicide layer is leveled with an upper surface of the first layer.

10. The device of claim 1, further comprising a dummy conductive layer which is formed between the first layer and the first conductive layer, and in which the pair of through holes are formed,
   wherein a junction interface between the silicon layer and the silicide layer is higher than a lower surface of the dummy conductive layer and lower than an upper surface of the dummy conductive layer.

11. A nonvolatile semiconductor memory device comprising:
   a semiconductor substrate;
   a first insulating layer formed above the semiconductor substrate;
   a first conductive layer formed on the first insulating layer;
   a second conductive layer formed above the first conductive layer;
   a third conductive layer formed above the second conductive layer;
   a second insulating layer formed on the third conductive layer;
   a block insulating layer formed on an inner surface of a through hole formed in the second insulating layer, the third conductive layer, the second conductive layer, the first conductive layer, and the first insulating layer, and extending in a stacking direction;
   a charge storage layer formed on the block insulating layer;
   a tunnel insulating layer formed on the charge storage layer; and
   a semiconductor pillar formed on the tunnel insulating layer,
   wherein the semiconductor pillar includes a doped silicide layer which is formed in the through hole formed in the second insulating layer, and in which an impurity is doped, a silicon layer formed in the through hole formed in the third conductive layer, the second conductive layer and the first conductive layer, and a silicide layer formed in the through hole formed in the first insulating layer.

* * * * *